(12) United States Patent
Ema et al.

(10) Patent No.: US 10,720,489 B2
(45) Date of Patent: Jul. 21, 2020

(54) SEMICONDUCTOR DEVICE HAVING RESISTANCE ELEMENTS AND FABRICATION METHOD THEREOF

(71) Applicant: UNITED SEMICONDUCTOR JAPAN CO., LTD., Kuwana-Shi, Mie (JP)

(72) Inventors: Taiji Ema, Inabe (JP); Nobuhiro Misawa, Kuwana (JP); Kazuyuki Kumeno, Kuwana (JP); Makoto Yasuda, Kuwana (JP)

(73) Assignee: United Semiconductor Japan Co., Ltd., Kuwana (JP)

( * ) Notice: Subject to any disclaimer, the term of this patent is extended or adjusted under 35 U.S.C. 154(b) by 0 days.

(21) Appl. No.: 16/460,400

(22) Filed: Jul. 2, 2019

(65) Prior Publication Data

US 2019/0326385 A1  Oct. 24, 2019

Related U.S. Application Data

(62) Division of application No. 15/992,645, filed on May 30, 2018, now Pat. No. 10,510,824, which is a
(Continued)

(30) Foreign Application Priority Data

Feb. 19, 2016  (JP) ................................ 2016-029457

(51) Int. Cl.
*H01L 27/06* (2006.01)
*H01L 49/02* (2006.01)
*H01L 27/08* (2006.01)

(52) U.S. Cl.
CPC .......... *H01L 28/20* (2013.01); *H01L 27/0802* (2013.01); *H01L 27/0629* (2013.01)

(58) Field of Classification Search
CPC .. H01L 28/20; H01L 27/0802; H01L 27/0629
(Continued)

(56) References Cited

U.S. PATENT DOCUMENTS

| 5,489,547 A | 2/1996 | Erdeljac et al. |
| 2002/0084496 A1 | 7/2002 | Chatani |

(Continued)

FOREIGN PATENT DOCUMENTS

| JP | 9-36310 A | 2/1997 |
| JP | 9-283706 A | 10/1997 |

(Continued)

OTHER PUBLICATIONS

Office Action dated Jul. 16, 2019, issued in counterpart JP Application No. 2016-029457, with English machine translation. (8 pages).

(Continued)

*Primary Examiner* — Selim U Ahmed
(74) *Attorney, Agent, or Firm* — Westerman, Hattori, Daniels & Adrian, LLP

(57) ABSTRACT

A semiconductor device includes as a resistance element a first polycrystalline silicon and a second polycrystalline silicon containing impurities, such as boron, of the same kind and having different widths. The first polycrystalline silicon contains the impurities at a concentration $C_X$. The second polycrystalline silicon has a width larger than a width of the first polycrystalline silicon and contains the impurities of the same kind at a concentration $C_Y$ lower than the concentration $C_X$. A sign of a temperature coefficient of resistance (TCR) of the first polycrystalline silicon changes at the concentration $C_X$. A sign of a TCR of the second polycrystalline silicon changes at the concentration $C_Y$.

20 Claims, 26 Drawing Sheets

Related U.S. Application Data division of application No. 15/402,367, filed on Jan. 10, 2017, now Pat. No. 10,014,363.

(58) Field of Classification Search
USPC .......................................................... 257/536
See application file for complete search history.

(56) References Cited

U.S. PATENT DOCUMENTS

| | | |
|---|---|---|
| 2003/0052386 A1 | 3/2003 | Yamaguchi |
| 2006/0145296 A1* | 7/2006 | Coolbaugh ............. H01L 28/20 257/536 |
| 2011/0279201 A1* | 11/2011 | Pensala ................ H03H 3/0076 333/219.1 |
| 2013/0033309 A1 | 2/2013 | Choi |

FOREIGN PATENT DOCUMENTS

| | | |
|---|---|---|
| JP | 2000-228496 A | 8/2000 |
| JP | 2003-100749 A | 4/2003 |
| JP | 2013-243276 A | 12/2013 |

OTHER PUBLICATIONS

Chuang et al., "Temperature-Dependent Characteristics of Polysilicon and Diffused Resistors", IEEE Transactions on Electron Devices, vol. 50, No. 5, May 2003, pp. 1413-1415 (3 pages).

Raman et al., Physical Model for the Resistivity and Temperature Coefficient of Resistivity of Heavily doped Polysilicon, IEEE Transactions on Electron Devices, vol. 53, No. 8, Aug. 2008, pp. 1885-1892.

Notice of Allowance dated Mar. 21, 2018, issued in U.S. Appl. No. 15/402,367 (7 pages).

Non-Final Office Action dated Aug. 25, 2017, issued in U.S. Appl. No. 15/402,367 (10 pages).

Final Office Action dated Dec. 14, 2017, issued in U.S. Appl. No. 15/402,367 (6 pages).

Non-Final Office Action dated Oct. 18, 2018, issued in U.S. Appl. No. 15/992,645 (13 pages).

Notice of Allowance dated Apr. 3, 2019, issued in U.S. Appl. No. 15/992,645 (10 pages).

Non-Final Office Action dated Sep. 6, 2019, issued in U.S. Appl. No. 16/460,497 (23 pages).

Office Action dated Jan. 22, 2020, issued in counterpart CN Application No. 2017100606496, with English translation (18 pages).

* cited by examiner

SEMICONDUCTOR DEVICE HAVING RESISTANCE ELEMENTS AND FABRICATION METHOD THEREOF

CROSS-REFERENCE TO RELATED APPLICATION

This application is a Divisional Application of U.S. application Ser. No. 15/992,645, filed on May 30, 2018, which is a Divisional of U.S. application Ser. No. 15/402,367, filed on Jan. 10, 2017, now U.S. Pat. No. 10,014,363 issued on Jul. 3, 2018, which is based upon and claims the benefit of priority of the prior Japanese Patent Application No. 2016-029457, filed on Feb. 19, 2016, the entire contents of which are incorporated herein by reference.

FIELD

The embodiments discussed herein are related to a semiconductor device and a semiconductor device fabrication method.

BACKGROUND

Semiconductor devices including resistance elements are known. The technique of using a polycrystalline silicon or a diffusion layer in a semiconductor substrate containing determined impurities as a result of ion implantation, metal, metal nitride, or the like as a resistance element is known. Furthermore, the technique of forming resistance elements having different properties in a semiconductor device is known.

Japanese Laid-open Patent Publication No. 2000-228496
Japanese Laid-open Patent Publication No. 2003-100749
Japanese Laid-open Patent Publication No. 09-36310
Japanese Laid-open Patent Publication No. 2013-243276

The resistance value of a resistance element may change according to temperature. If the resistance value of a resistance element included in a semiconductor device changes materially at a temperature at the time of the operation of the semiconductor device, the performance of the semiconductor device including the resistance element may deteriorate.

SUMMARY

According to an aspect, there is provided a semiconductor device including a first polycrystalline silicon containing first impurities at a first concentration and having a first width and a second polycrystalline silicon containing the first impurities at a second concentration lower than the first concentration and having a second width larger than the first width, a sign of a temperature coefficient of the first polycrystalline silicon changing at the first concentration, a sign of a temperature coefficient of the second polycrystalline silicon changing at the second concentration.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

First examples of the structure and characteristic of a resistance element used in a semiconductor device will be described with reference to FIGS. 1A through 1C and 2 through 7.

Figure 1A:
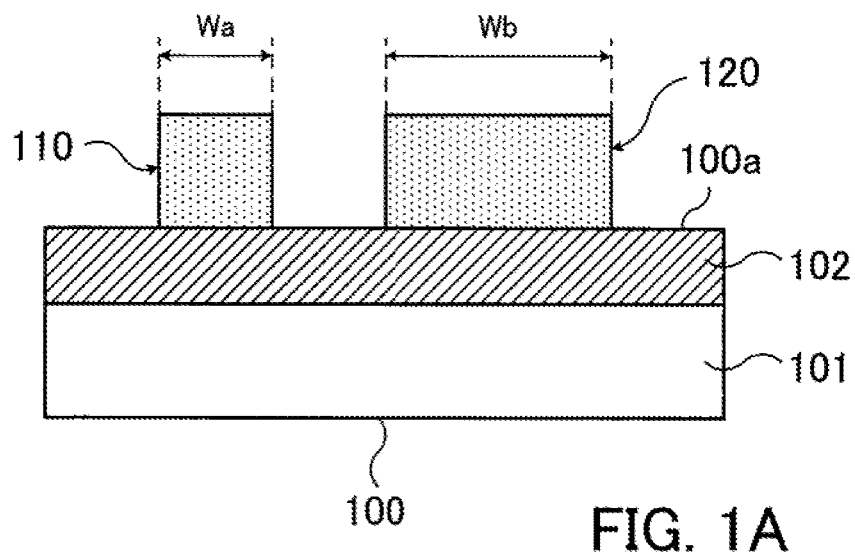
FIGS. 1A through 1C illustrate an example of the structure of a resistance element.
Figure 1B:
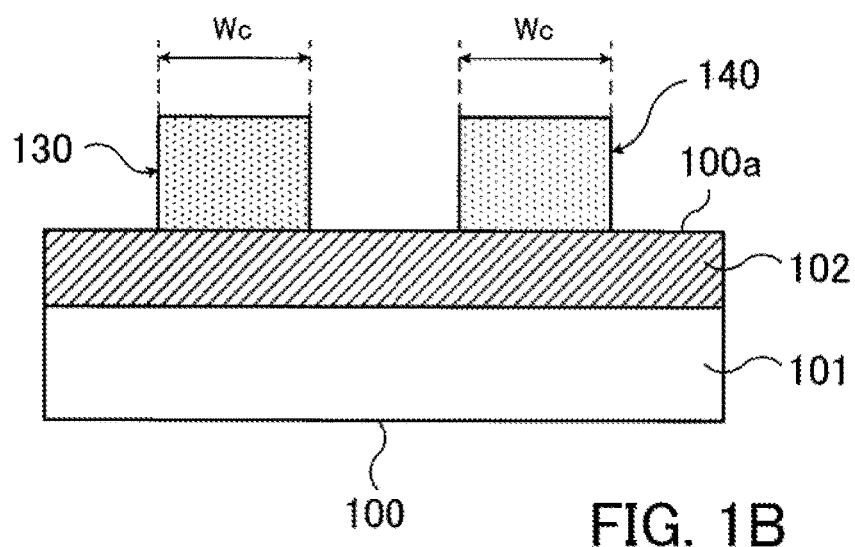
Figure 1C:
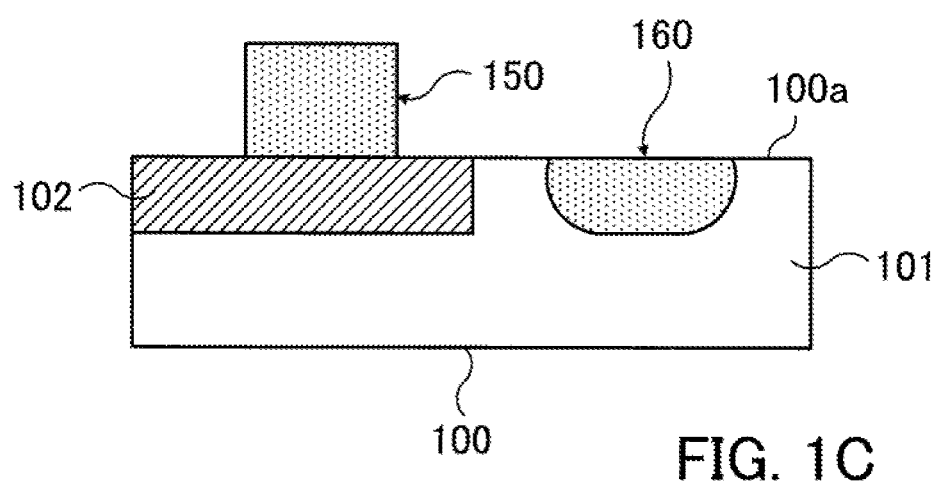

FIGS. 1A through 1C illustrate an example of the structure of a resistance element.

FIG. 1A is a fragmentary schematic sectional view of two resistance elements 110 and 120 as an example formed over a substrate 100. For example, the substrate 100 is a semiconductor substrate 101 having an insulating film 102, such as an isolation film, in the surface 100a. The resistance element 110 having a width Wa and the resistance element 120 having a width Wb larger than the width Wa are formed over the surface 100a (insulating film 102) of the above substrate 100. The resistance elements 110 and 120 which are formed side by side over the surface 100a and which are equal or approximately equal in thickness are illustrated as an example. The resistance elements 110 and 120 are formed by the use of, for example, a polycrystalline silicon containing p-type or n-type impurities at a determined concentration.

FIG. 1B is a fragmentary schematic sectional view of resistance elements 130 and 140 as another example which are formed over a surface 100a (insulating film 102) of a substrate 100 and which are equal or approximately equal in width. The resistance elements 130 and 140 are We or about We in width. The resistance elements 130 and 140 which are formed side by side over the surface 100a and which are equal or approximately equal in thickness are illustrated as an example. The resistance elements 130 and 140 are formed by the use of, for example, a polycrystalline silicon containing p-type or n-type impurities at a determined concentration.

FIG. 1C is a fragmentary schematic sectional view of resistance elements 150 and 160 as still another example. The resistance element 150 is formed over a surface 100a (insulating film 102) of a substrate 100 and the resistance element 160 is formed in the surface 100a of the substrate 100 (in the semiconductor substrate 101). The resistance element 150 is formed by the use of, for example, a polycrystalline silicon containing p-type or n-type impurities at a determined concentration. The resistance element 160 is a diffusion layer containing p-type or n-type impurities at a determined concentration.

For example, the resistance elements illustrated in FIGS. 1A through 1C are cited as resistance elements used in semiconductor devices.

By the way, the resistance values of various resistance elements may change according to temperature. The dependence of a resistance element on temperature is adjusted by, for example, the size, such as the width, of the resistance element, the kind of impurities contained, or impurity concentration.

Figure 2:
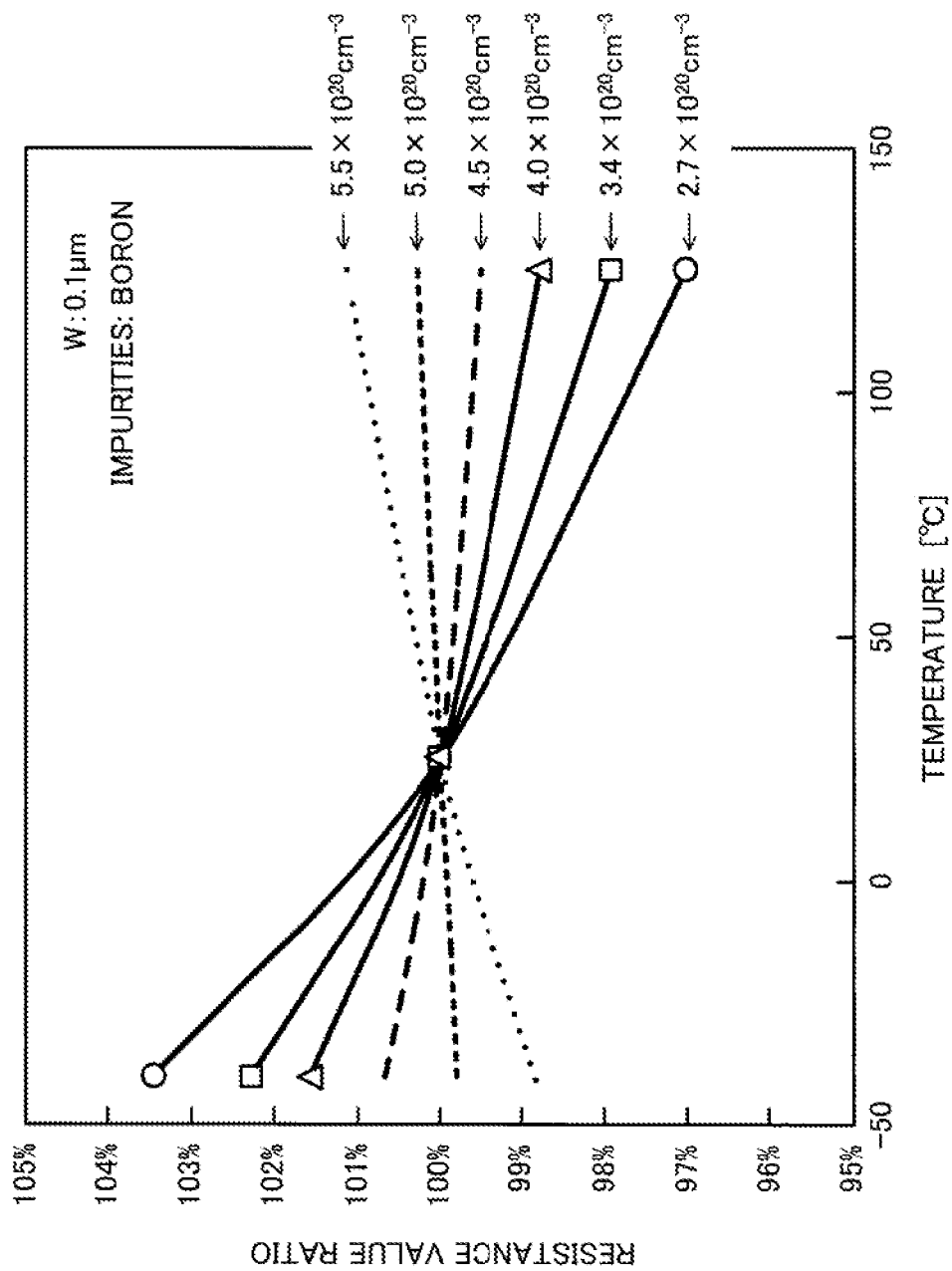
FIG. 2 indicates an example of the dependence of a resistance element on temperature (part 1)
Figure 3:
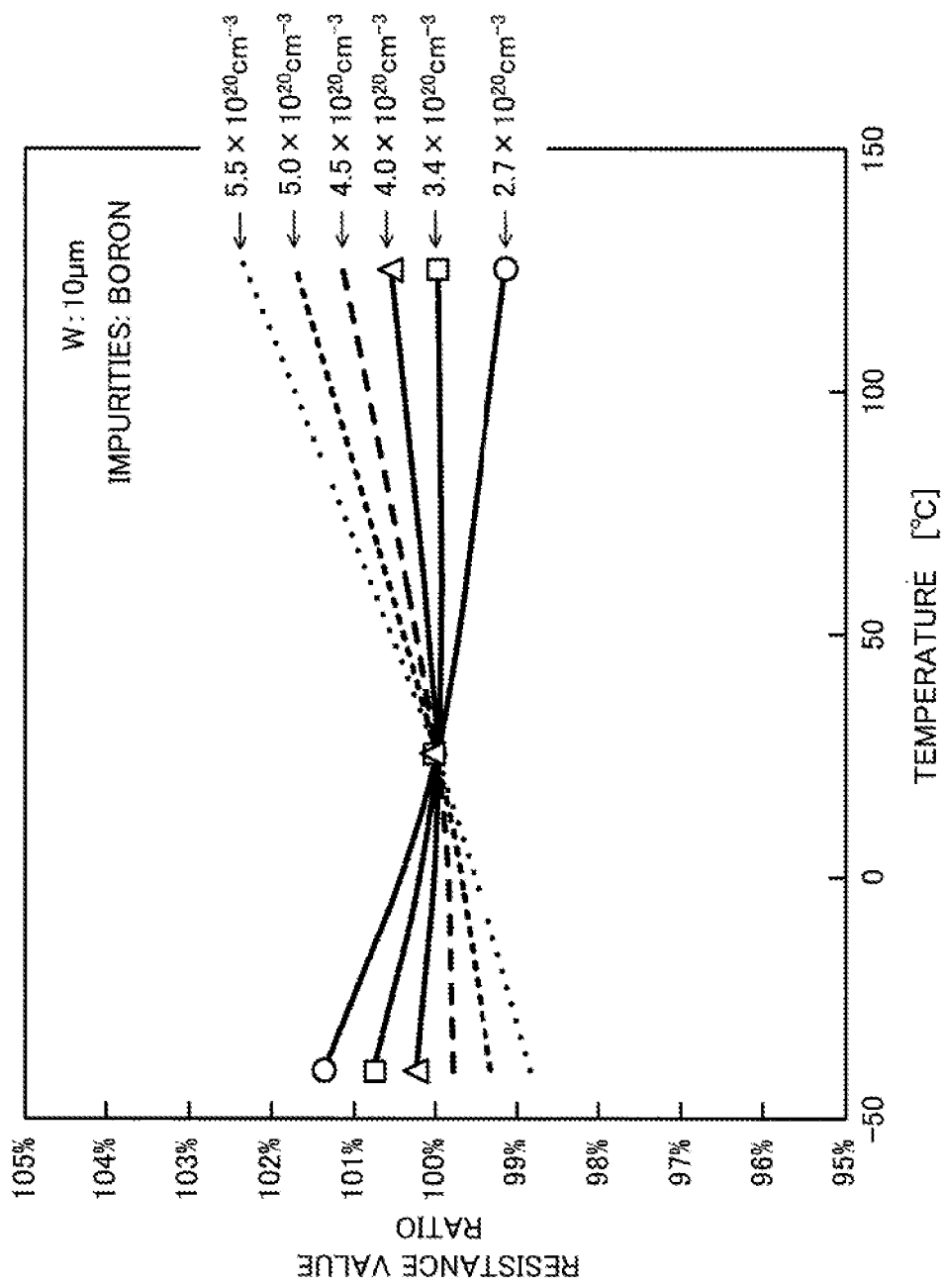
FIG. 3 indicates an example of the dependence of a resistance element on temperature (part 2)
Figure 4:
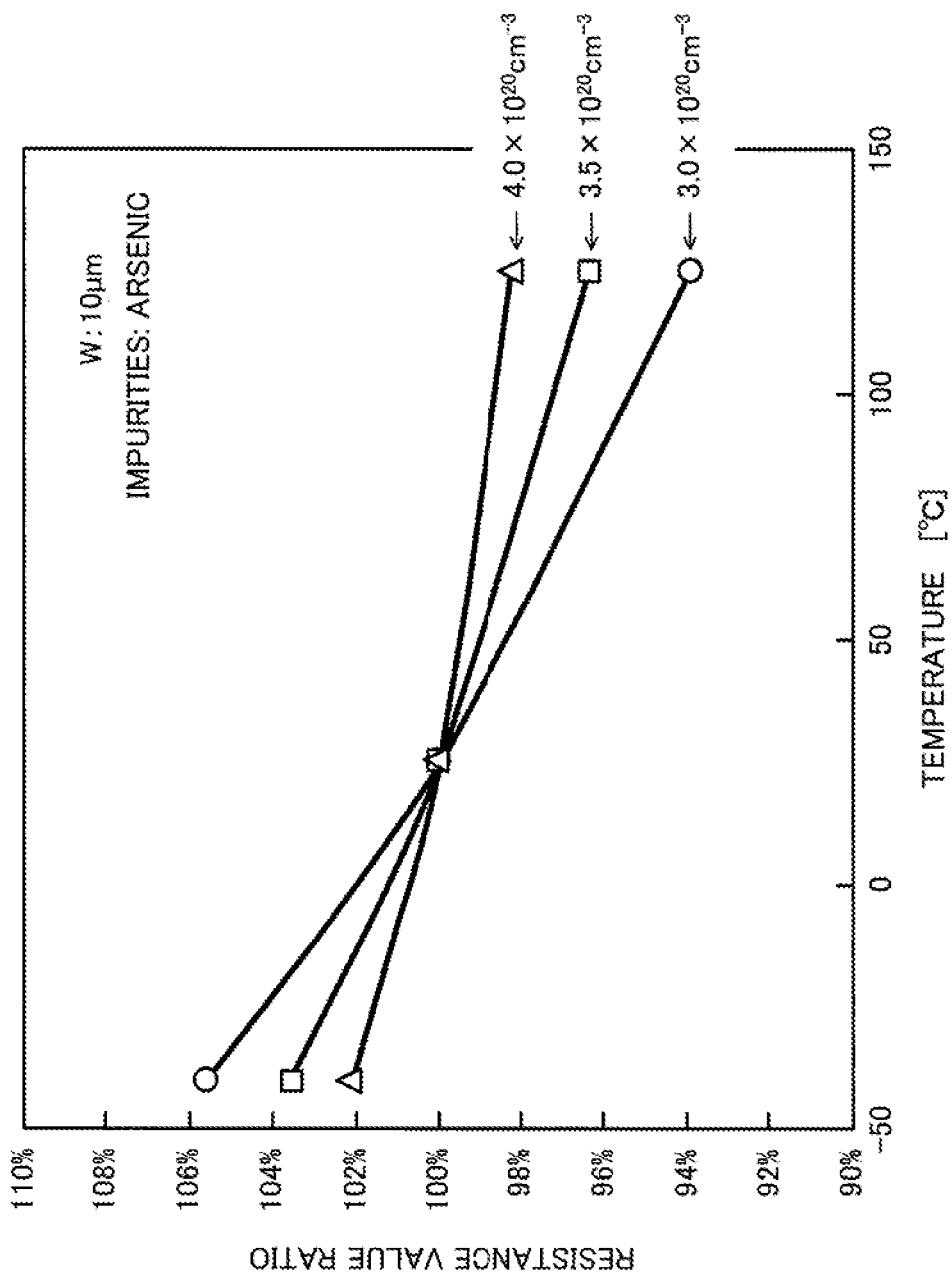
FIG. 4 indicates an example of the dependence of a resistance element on temperature (part 3)

Examples of the dependence of resistance elements on temperature are indicated in FIGS. 2 through 4.

FIGS. 2 and 3 indicate examples of the relationship between the temperature (° C.) and resistance value ratio (%) of polycrystalline silicons which are 0.1 μm and 10 μm, respectively, in width W. The resistance value ratio represents the ratio of a resistance value at each temperature to a resistance value at a temperature of 25° C.

FIG. 2 indicates the relationship between temperature and resistance value ratio for a polycrystalline silicon having a width W of 0.1 μm and containing boron (B) as p-type impurities at concentrations of $2.7 \times 10^{20}$ $cm^{-3}$, $3.4 \times 10^{20}$ $cm^{-3}$, $4.0 \times 10^{20}$ $cm^{-3}$, $4.5 \times 10^{20}$ $cm^{-3}$, $5.0 \times 10^{20}$ $cm^{-3}$, and $5.5 \times 10^{20}$ $cm^{-3}$.

FIG. 3 indicates the relationship between temperature and resistance value ratio for a polycrystalline silicon having a width W of 10 μm and containing boron as p-type impurities at concentrations of $2.7 \times 10^{20}$ $cm^{-3}$, $3.4 \times 10^{20}$ $cm^{-3}$, $4.0 \times 10^{20}$ $cm^{-3}$, $4.5 \times 10^{20}$ cm 3, $5.0 \times 10^{20}$ $cm^{-3}$, and $5.5 \times 10^{20}$ $cm^{-3}$.

In FIGS. 2 and 3, the relationship between temperature and resistance value ratio at the time of boron concentrations being $4.5 \times 10^{20}$ $cm^{-3}$, $5.0 \times 10^{20}$ $cm^{-3}$, and $5.5 \times 10^{20}$ $cm^{-3}$ is obtained by extrapolation. To be concrete, a resistance value at each boron concentration is calculated from a correlation between log(dose) and a resistance value at each temperature and resistance value ratio is calculated.

With a polycrystalline silicon having a width W of 0.1 μm, FIG. 2 indicates the following. If boron concentration is relatively low ($2.7 \times 10^{20}$ $cm^{-3}$, for example), resistance value ratio becomes higher with a drop in the temperature below 25° C. and becomes lower with a rise in the temperature above 25° C. With a polycrystalline silicon having a width W of 0.1 μm, resistance value ratio at a temperature below 25° C. tends to fall with an increase in boron concentration, and resistance value ratio at a temperature above 25° C. tends to rise with an increase in boron concentration.

As indicated in FIG. 3, the same applies to a polycrystalline silicon having a width W of 10 μm. That is to say, if boron concentration is relatively low ($2.7 \times 10^{20}$ $cm^{-3}$, for example), resistance value ratio becomes higher with a drop in the temperature below 25° C. and becomes lower with a rise in the temperature above 25° C. With a polycrystalline silicon having a width W of 10 μm, resistance value ratio at a temperature below 25° C. tends to fall with an increase in boron concentration, and resistance value ratio at a temperature above 25° C. tends to rise with an increase in boron concentration.

Furthermore, FIG. 4 indicates the relationship between temperature and resistance value ratio for a polycrystalline silicon having a width W of 10 μm and containing arsenic (As) as n-type impurities at concentrations of $3.0 \times 10^{20}$ $cm^{-3}$, $3.5 \times 10^{20}$ $cm^{-3}$, and $4.0 \times 10^{20}$ $cm^{-3}$.

As indicated in FIG. 4, even with a polycrystalline silicon having a width W of 10 μm and containing arsenic as n-type impurities, resistance value ratio at a temperature below 25° C. tends to fall with an increase in arsenic concentration, and resistance value ratio at a temperature above 25° C. tends to rise with an increase in arsenic concentration.

The dependence of various resistance elements, such as the above polycrystalline silicon and diffusion layer each containing impurities, on temperature is evaluated by the use of a temperature coefficient.

Figure 5:
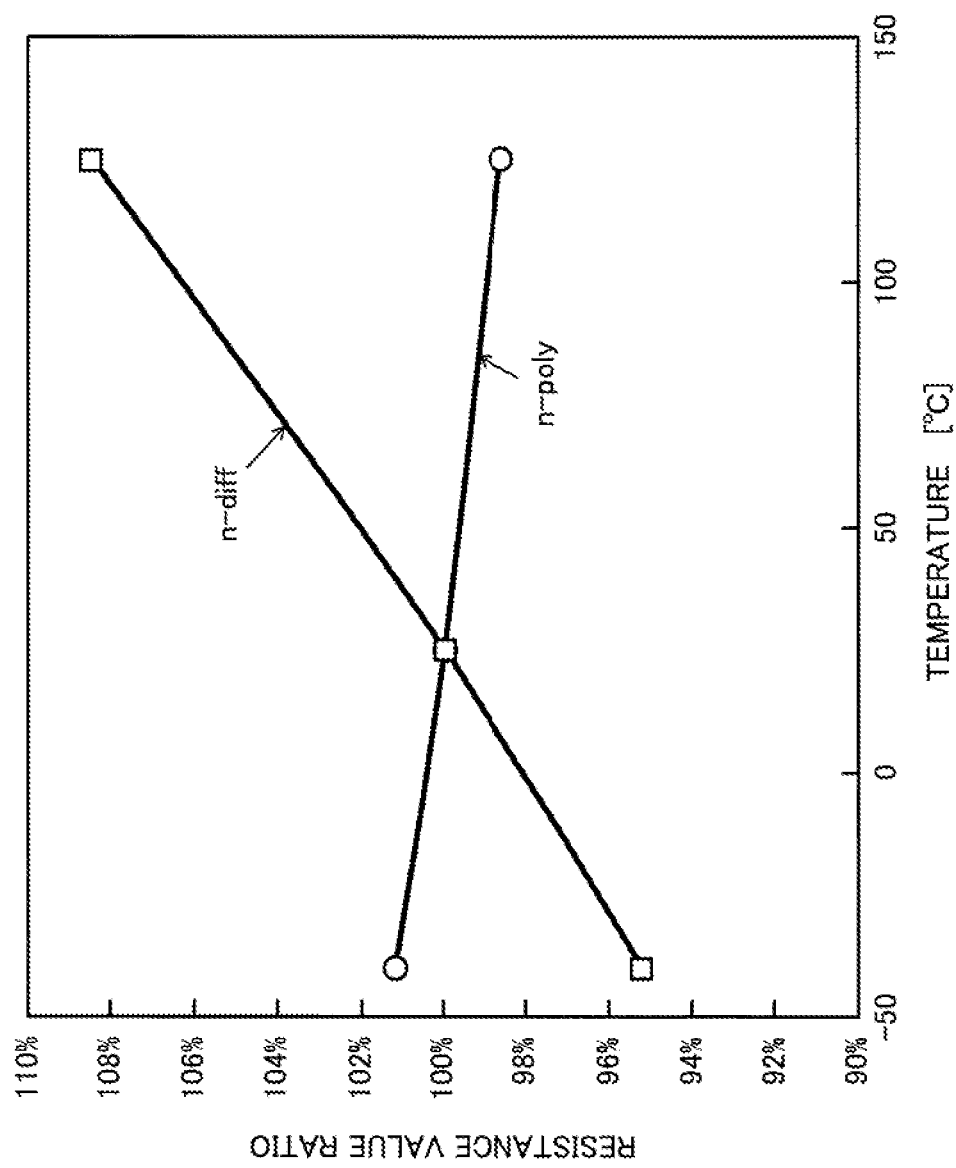
FIG. 5 is a view for describing a temperature coefficient.

FIG. 5 is a view for describing a temperature coefficient.

FIG. 5 indicates an example of the relationship between temperature (° C.) and resistance value ratio (%) for a polycrystalline silicon (n-poly) and a diffusion layer (n-diff) each containing n-type impurities. The resistance value ratio represents the ratio of a resistance value at each temperature to a resistance value at a temperature of 25° C.

A resistance value $R_T$ at temperature TOC is given by the linear approximate expression $$R_T = R_{25} \times \{(T-25) \times A + 1\} \quad (1)$$

where $R_{25}$ is a resistance value at a temperature of 25° C. and the coefficient A is a temperature coefficient of resistance (TCR) (ppm/° C.). In the example of FIG. 5, the TCR of the polycrystalline silicon (n-poly) containing the n-type impurities is −300 ppm/° C. and the TCR of the diffusion layer (n-diff) containing the n-type impurities is 1600 ppm/° C.

The dependence of various resistance elements on temperature is evaluated by the use of, for example, such a TCR.

Figure 6:
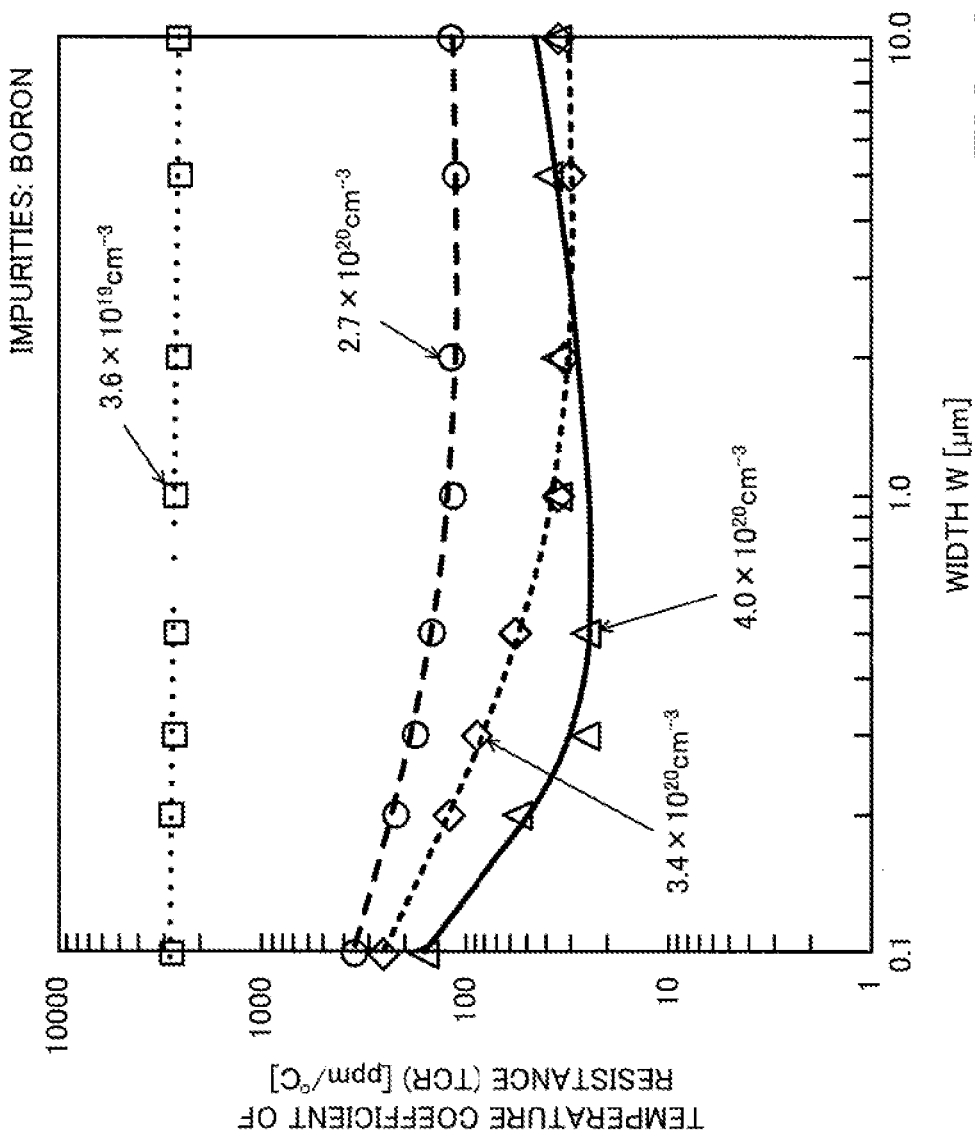
FIG. 6 indicates an example of the relationship between the width and temperature coefficient of a polycrystalline silicon.

FIG. 6 indicates an example of the relationship between the width and temperature coefficient of a polycrystalline silicon.

FIG. 6 indicates an example of the relationship between the width W (μm) and TCR (ppm/° C.) of a polycrystalline silicon obtained in the case of the polycrystalline silicon with a determined width W containing impurities at different concentrations in accordance with the examples of FIGS. 2 through 4.

In the example of FIG. 6, boron is selected as impurities and the TCR of a polycrystalline silicon with width W containing boron at concentrations of $3.6 \times 10^{19}$ cm$^{-3}$, $2.7 \times 10^{20}$ cm$^{-3}$, $3.4 \times 10^{20}$ cm$^{-3}$, and $4.0 \times 10^{20}$ cm$^{-3}$ are plotted for the width W.

As indicated in FIG. 6, if boron concentration is lower than $1 \times 10^{20}$ cm$^{-3}$ ($3.6 \times 10^{19}$ cm$^{-3}$, for example), then the dependence of the TCR on the width W is small.

If boron concentration in a polycrystalline silicon is increased to $2.7 \times 10^{20}$ cm$^{-3}$ and then $3.4 \times 10^{20}$ cm$^{-3}$, the TCR falls regardless of the width W. At each boron concentration, a polycrystalline silicon having a larger width W has a relatively low TCR.

If boron concentration in a polycrystalline silicon is increased further to $4.0 \times 10^{20}$ cm$^{-3}$, the TCR continues to fall in a range in which the width W is relatively small, but, on the other hand, the TCR starts to rise in a range in which the width W is relatively large.

If boron concentration in a polycrystalline silicon is increased further, the TCR rises regardless of the width W (FIGS. 2 and 3).

A resistance element using a polycrystalline silicon whose width W is relatively large is used in a circuit, such as an analog circuit, which demands high relative accuracy. A resistance element using a polycrystalline silicon whose width W is relatively small is used in a circuit, such as a real time clock (RTC) circuit, in which high resistance is realized by a small area even at a little sacrifice of relative accuracy. It is desirable that in each case, the dependence of the polycrystalline silicon in the resistance element on temperature and the TCR of the polycrystalline silicon in the resistance element be small.

When resistance elements having different widths are formed in a semiconductor device by the use of a polycrystalline silicon, the following method, for example, may be adopted. Polycrystalline silicons having different widths W are formed over a substrate and impurity ions are implanted in them at the same time with a determined dose. The polycrystalline silicons having different widths are approximately equal in thickness.

In this case, a dose at the time of implanting impurity ions (impurity concentration in the polycrystalline silicons) may be set with the polycrystalline silicon whose width W is relatively large as reference so as to make the TCR of the polycrystalline silicon whose width W is relatively large low. As a result, the TCR of the polycrystalline silicon whose width W is relatively small may become high (FIG. 6). Conversely, if a dose at the time of implanting impurity ions (impurity concentration in the polycrystalline silicons) is set with the polycrystalline silicon whose width W is relatively small as reference so as to make the TCR of the polycrystalline silicon whose width W is relatively small low, then the TCR of the polycrystalline silicon whose width W is relatively large may become high (FIG. 6).

With a semiconductor device including a resistance element formed by the use of a polycrystalline silicon whose TCR is high, a rise and drop in the temperature caused by the operation lead to a significant change in the resistance value of the resistance element. As a result, the performance of the semiconductor device may deteriorate.

Furthermore, the following technique is known as to a semiconductor device. A resistance element having a positive TCR and a resistance element having a negative TCR are electrically connected in series. By doing so, the dependence of one resistance element on temperature cancels out the dependence of the other resistance element on temperature and the TCR of an element (connected body) formed by connecting both resistance elements is made low. With this technique, however, a desired TCR may not be obtained by connection, depending on the composition ratio of a group of resistance elements to be connected.

Figure 7:
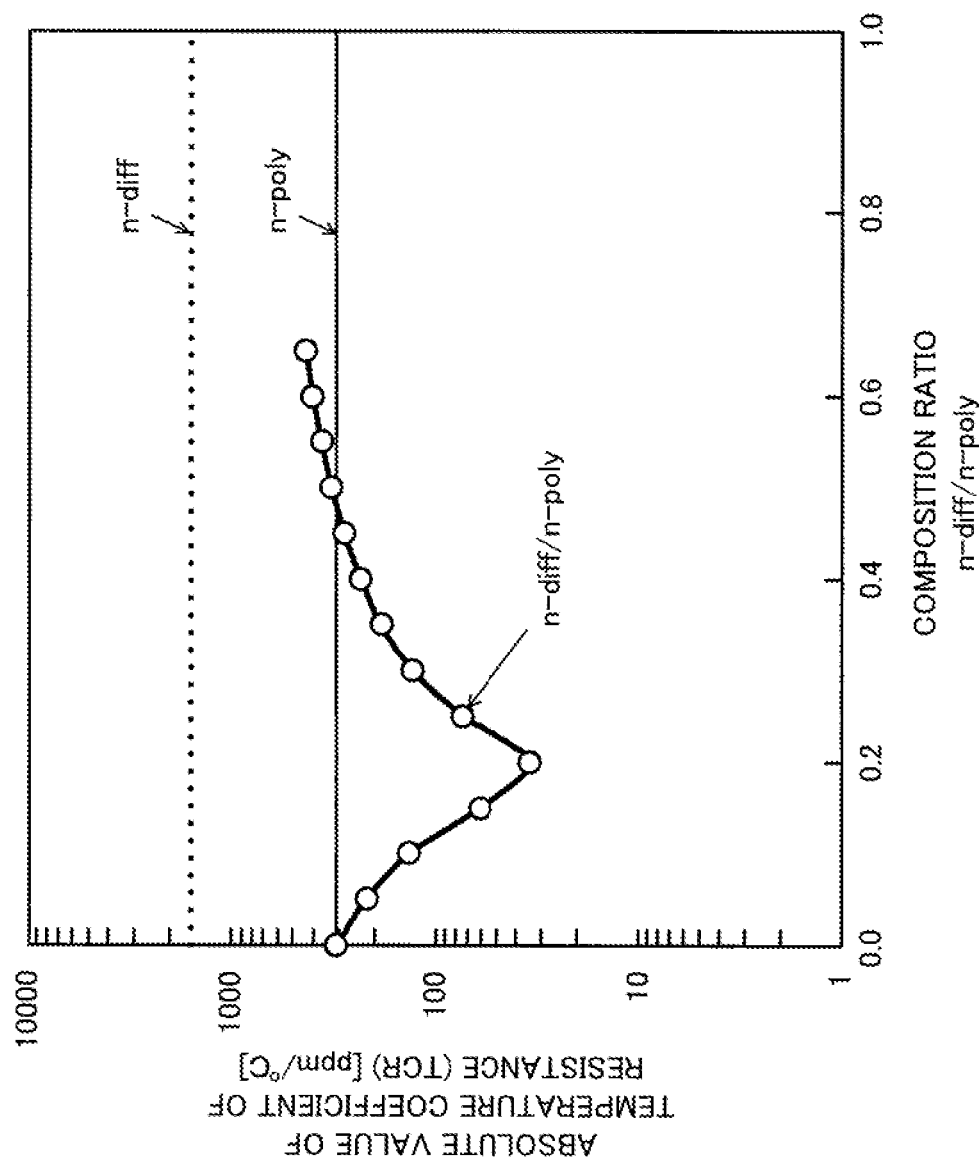
FIG. 7 indicates an example of the relationship between the composition ratio of a group of resistance elements and the absolute value of a temperature coefficient.

FIG. 7 indicates an example of the relationship between the composition ratio of a group of resistance elements and the absolute value of a temperature coefficient.

A combination of a polycrystalline silicon (n-poly) and a diffusion layer (n-diff) each containing n-type impurities and described in FIG. 5 will be taken as an example. With this example the relationship between the composition ratio (n-diff/n-poly) of a diffusion layer containing n-type impurities to a polycrystalline silicon containing the n-type impurities and the absolute value of a TCR (ppm/° C.) is indicated in FIG. 7.

As indicated in FIG. 7, as the ratio of a diffusion layer (n-diff) containing n-type impurities to a polycrystalline silicon (n-poly) containing the n-type impurities increases, the absolute value of a TCR once decreases and then increases. In this example, the absolute value of a TCR is minimized when the composition ratio of a diffusion layer containing n-type impurities to a polycrystalline silicon containing the n-type impurities is about 0.2. Therefore, the composition ratio (n-diff/n-poly) of a diffusion layer containing n-type impurities to a polycrystalline silicon containing the n-type impurities is set to about 0.2 and the diffusion layer containing the n-type impurities and the polycrystalline silicon containing the n-type impurities are connected. At this time the TCR of the diffusion layer containing the n-type impurities cancels out most effectively the TCR of the polycrystalline silicon containing the n-type impurities. As a result, the absolute value of the TCR of a connected body formed is minimized.

However, the TCR of both the polycrystalline silicon containing the n-type impurities and the diffusion layer containing the n-type impurities are relatively high. If high TCRs cancel out each other, deviation of the composition ratio from the optimum value (about 0.2) is apt to widen the difference between the absolute value of a TCR obtained at that time and the minimum absolute value of a TCR.

If deviation of the composition ratio of a group of resistance elements to be connected from an optimum value makes in this way a TCR after connection high, the operation of a semiconductor device causes a significant change in the resistance value of a connected body formed of the group of resistance elements. This may lead to deterioration in the performance of the semiconductor device.

In view of the above problem, a technique described below as embodiments will be adopted to suppress the dependence of a resistance element on temperature and deterioration in the performance of a semiconductor device caused by a TCR.

A first embodiment will be described first.

Figure 8:
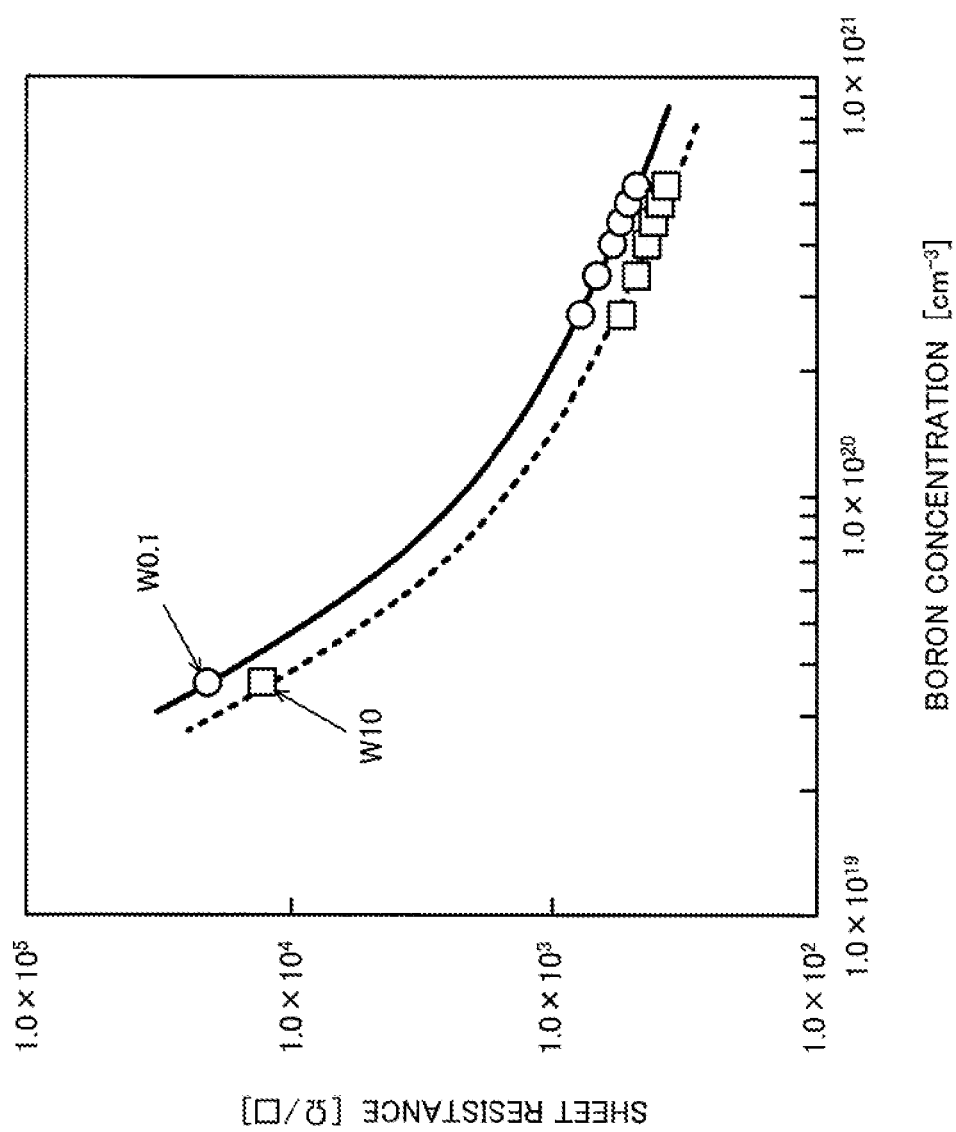
FIG. 8 is a view for describing a resistance element according to a first embodiment (part 1)
Figure 9:
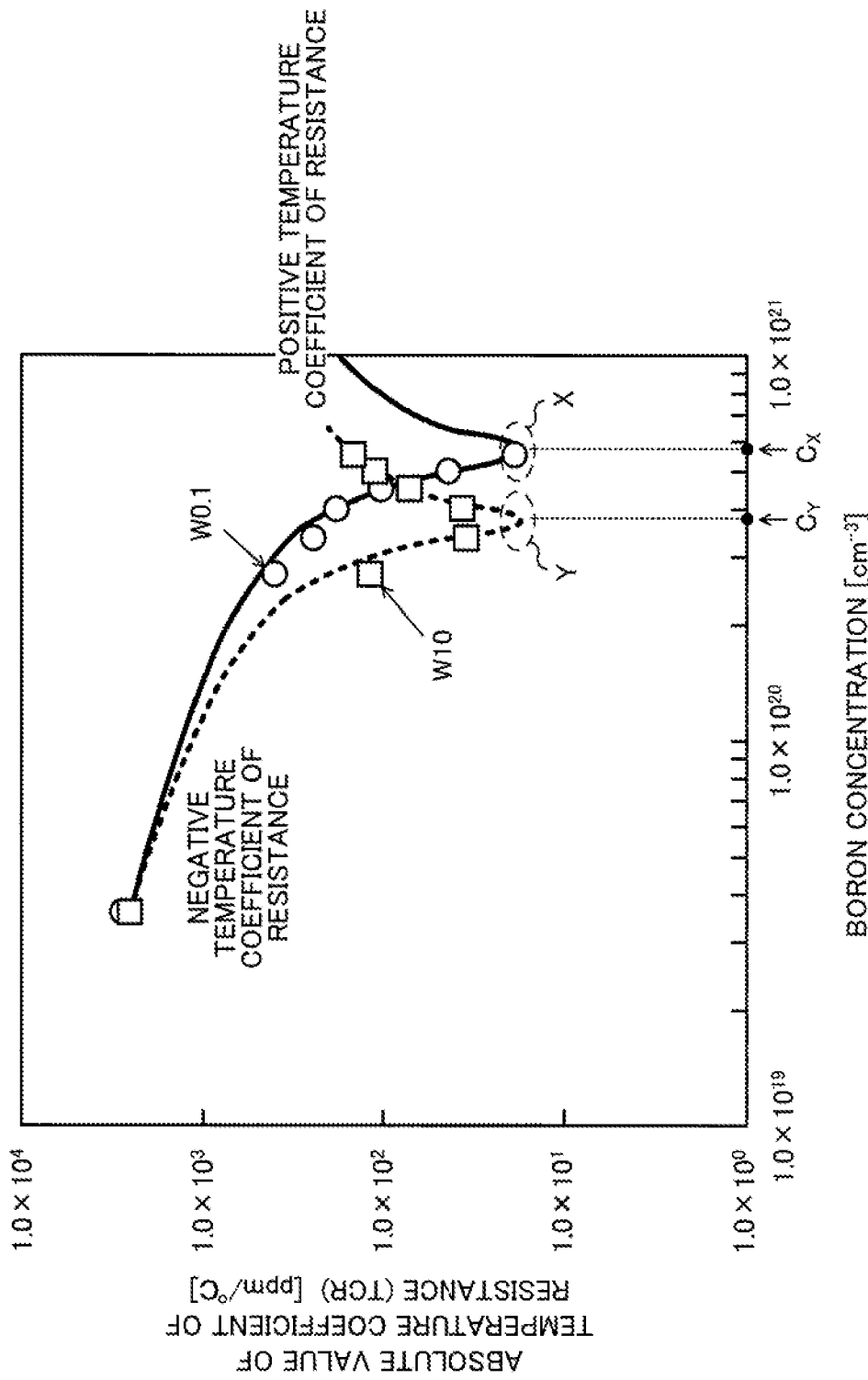
FIG. 9 is a view for describing a resistance element according to a first embodiment (part 2)

FIGS. 8 and 9 are views for describing a resistance element according to a first embodiment.

Polycrystalline silicons containing impurities and having widths W of 0.1 μm and 10 μm are used as resistance elements. Boron, which is a p-type impurity, is used as impurities contained in the polycrystalline silicons.

FIG. 8 indicates an example of the relationship between boron concentration ($cm^{-3}$) and sheet resistance ($\Omega/\square$) for the polycrystalline silicon (W0.1) having a width W of 0.1 μm and the polycrystalline silicon (W10) having a width W of 10 μm.

With both the polycrystalline silicon having a width W of 0.1 μm and the polycrystalline silicon having a width W of 10 μm, as indicated in FIG. 8, as boron concentration increases, sheet resistance decreases monotonically. The sheet resistance of the polycrystalline silicon having a width W of 0.1 μm is higher than that of the polycrystalline silicon having a width W of 10 μm at a certain boron concentration.

FIG. 9 indicates an example of the relationship between boron concentration ($cm^{-3}$) and the absolute value of a TCR (ppm/° C.) for the polycrystalline silicon (W0.1) having a width W of 0.1 μm and the polycrystalline silicon (W10) having a width W of 10 μm.

With each of the polycrystalline silicon having a width W of 0.1 μm and the polycrystalline silicon having a width W of 10 μm, as indicated in FIG. 9, the sign of a TCR changes at a certain boron concentration. With the polycrystalline silicon having a width W of 0.1 μm, the sign of the TCR changes in the $5 \times 10^{20}$ to $6 \times 10^{20}$ $cm^{-3}$ boron concentration range. With the polycrystalline silicon having a width W of 10 μm, the sign of the TCR changes in the $3 \times 10^{20}$ to $4 \times 10^{20}$ $cm^{-3}$ boron concentration range. That is to say, a boron concentration at which the sign of a TCR changes differs among different polycrystalline silicon widths W.

Accordingly, with the polycrystalline silicon having a width W of 0.1 μm, boron concentration is set to a concentration $C_X$ at a sign change point X of the TCR. With the polycrystalline silicon having a width W of 10 μm, boron concentration is set to a concentration $C_Y$ at a sign change point Y of the TCR. Setting is performed in this way so that the polycrystalline silicon having a width W of 0.1 μm and the polycrystalline silicon having a width W of 10 μm will contain boron at the concentrations $C_X$ and $C_Y$ which correspond to the sign change points X and Y of the TCR and at which the absolute values of the TCRs are minimized. By doing so, the absolute values of the TCRs of the polycrystalline silicon having a width W of 0.1 μm and the polycrystalline silicon having a width W of 10 μm are minimized.

The formation of such a group of polycrystalline silicons as a resistance element in a semiconductor device suppresses a change in the resistance value of the resistance element caused by the operation of the semiconductor device and deterioration in the performance of the semiconductor device caused by the change in the resistance value of the resistance element. As a result, a semiconductor device which stably demonstrates its performance and an electronic device or an electronic apparatus in which the semiconductor device is used are realized.

In the first embodiment, the polycrystalline silicon having a width W of 0.1 μm and the polycrystalline silicon having a width W of 10 μm contain boron on the basis of the relationship indicated in FIG. 9 at the concentrations $C_X$ and $C_Y$ corresponding to the sign change points X and Y of the TCRs. Boron concentration is set for each of the polycrystalline silicons which differ in width W. As a result, the above situation which may arise by the use of the method of implanting impurity ions at the same time in polycrystalline silicons which differ in width W, that is to say, a situation in which one of the TCRs of polycrystalline silicons that differ in width W is high and in which the other is low is avoided.

On the basis of the relationship indicated in FIG. 9, for example, a resistance element for an analog circuit included in a semiconductor device is formed by the use of a polycrystalline silicon having a width W of 10 μm and containing boron at the concentration $C_Y$ corresponding to the sign change point Y of the TCR. A resistance element for an RTC circuit included in the semiconductor device is formed by the use of a polycrystalline silicon having a width W of 0.1 μm and containing boron at the concentration $C_X$ corresponding to the sign change point X of the TCR. This minimizes both the TCR of the resistance element for the analog circuit and the TCR of the resistance element for the RTC circuit.

Furthermore, a group of polycrystalline silicons obtained on the basis of the relationship indicated in FIG. 9, that is to say, a group of polycrystalline silicon having a width W of 0.1 μm and containing boron at the concentration $C_X$ corresponding to the sign change point X of the TCR and polycrystalline silicon having a width W of 10 μm and containing boron at the concentration $C_Y$ corresponding to the sign change point Y of the TCR may electrically connected in series or in parallel. Both the TCR of the polycrystalline silicon having a width W of 0.1 μm and containing boron at the concentration $C_X$ corresponding to the sign change point X of the TCR and the TCR of the polycrystalline silicon having a width W of 10 μm and containing boron at the concentration $C_Y$ corresponding to the sign change point Y of the TCR are minimized. Therefore, even if they are electrically connected, the TCR of a connected body formed is low. As a result, with the semiconductor device including the connected body formed by electrically connecting this group of polycrystalline silicons as a resistance element, a change in the resistance value of the resistance element caused by the operation of the semiconductor device and deterioration in the performance of the semiconductor device caused by the change in the resistance value of the resistance element are suppressed.

In the above example, boron, which is a p-type impurity, is used as an impurity contained in a polycrystalline silicon. However, an n-type impurity, such as arsenic or phosphorus (P), may be used as an impurity contained in a polycrystalline silicon.

If n-type impurities are used, the relationship between impurity concentration and the absolute value of a TCR is acquired for polycrystalline silicons having different widths W. On the basis of this relationship, impurity concentration in each polycrystalline silicon is set to concentration corresponding to a sign change point of the TCR. This is the same with the above example. A group of polycrystalline silicons in each of which impurity concentration is set to the above concentration are formed as a resistance element in a semiconductor device. By doing so, a change in the resistance value of the resistance element caused by the operation of the semiconductor device and deterioration in the performance of the semiconductor device caused by the change in the resistance value of the resistance element are suppressed.

Next, a second embodiment will be described.

Figure 10:
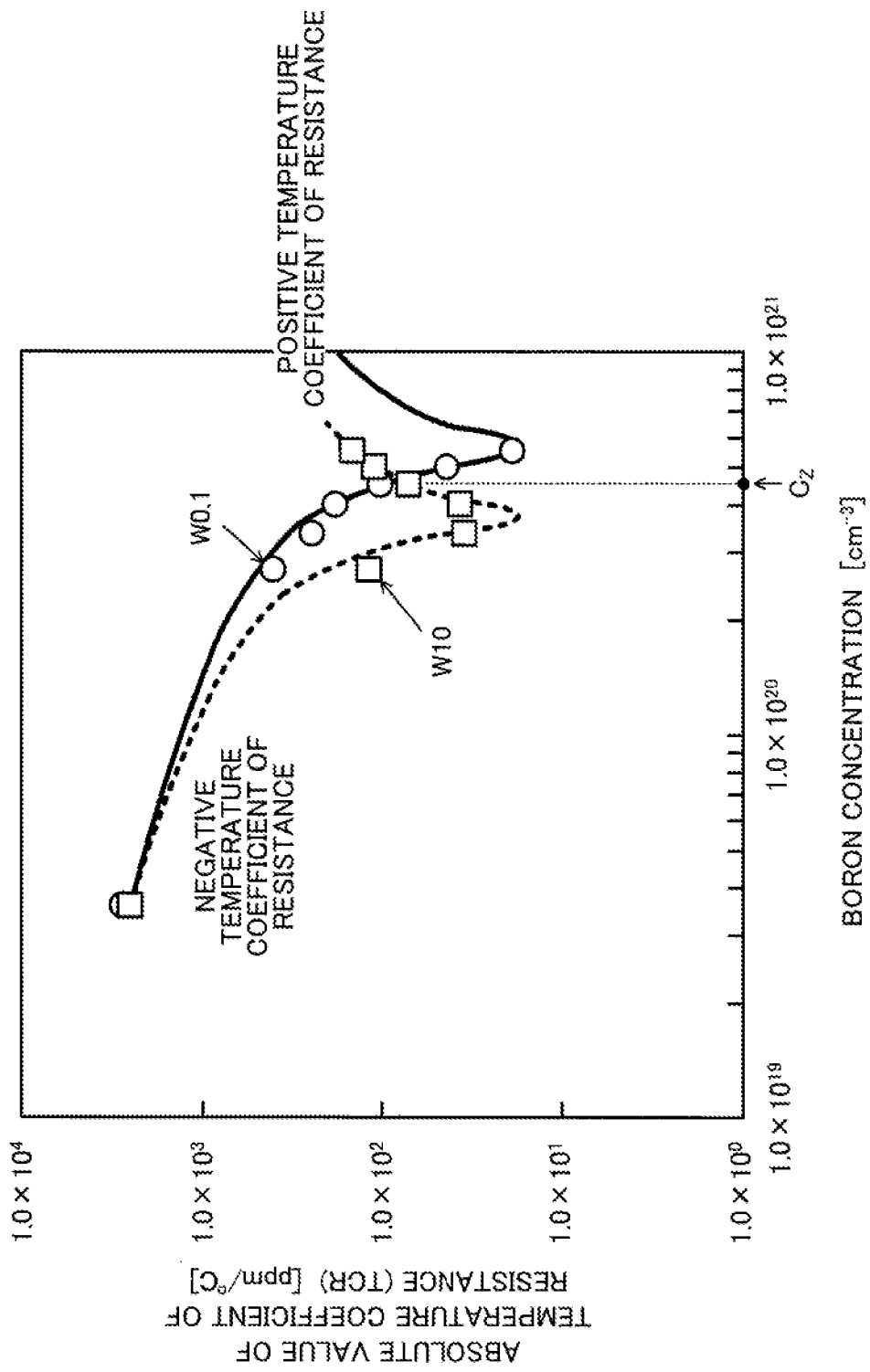
FIG. 10 is a view for describing a resistance element according to a second embodiment (part 1)
Figure 11:
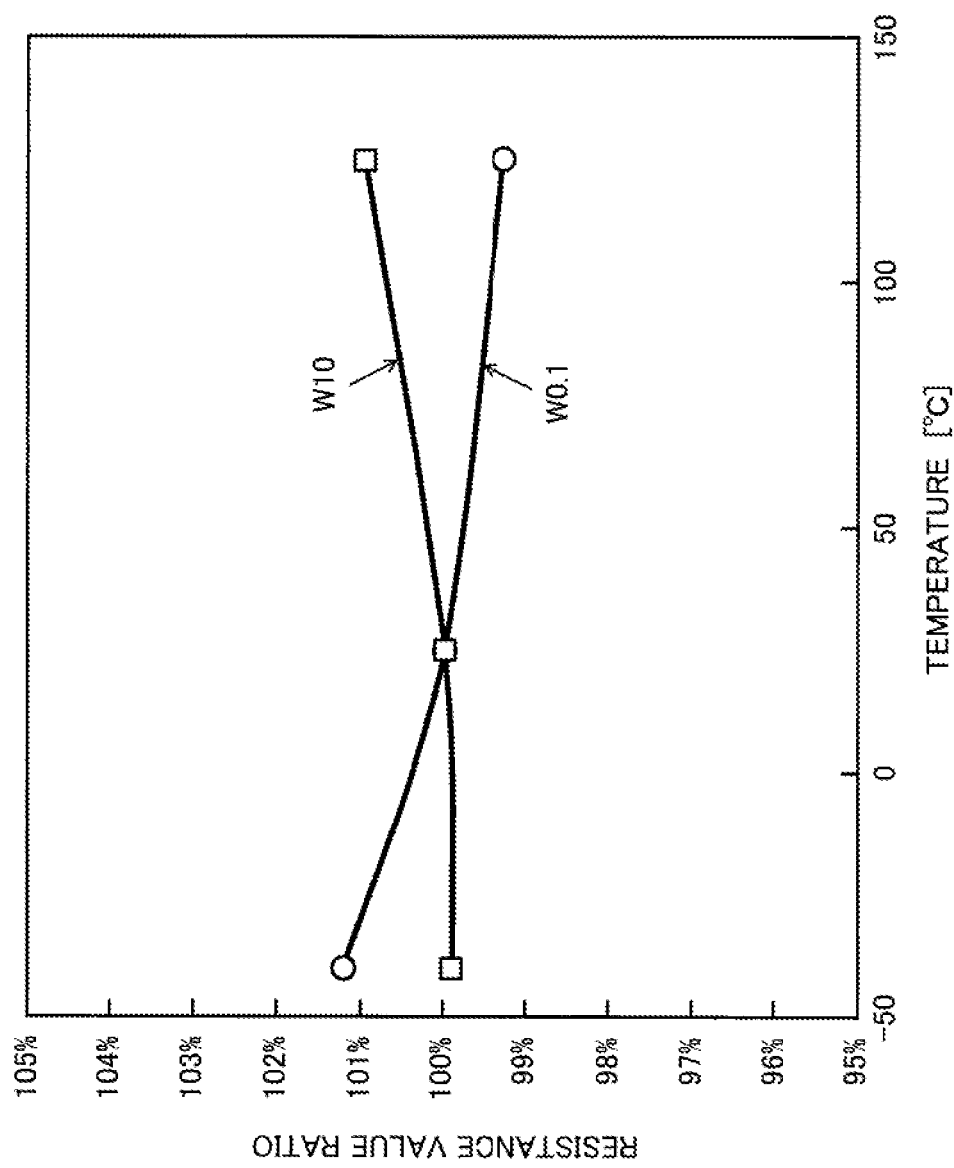
FIG. 11 is a view for describing a resistance element according to a second embodiment (part 2)
Figure 12:
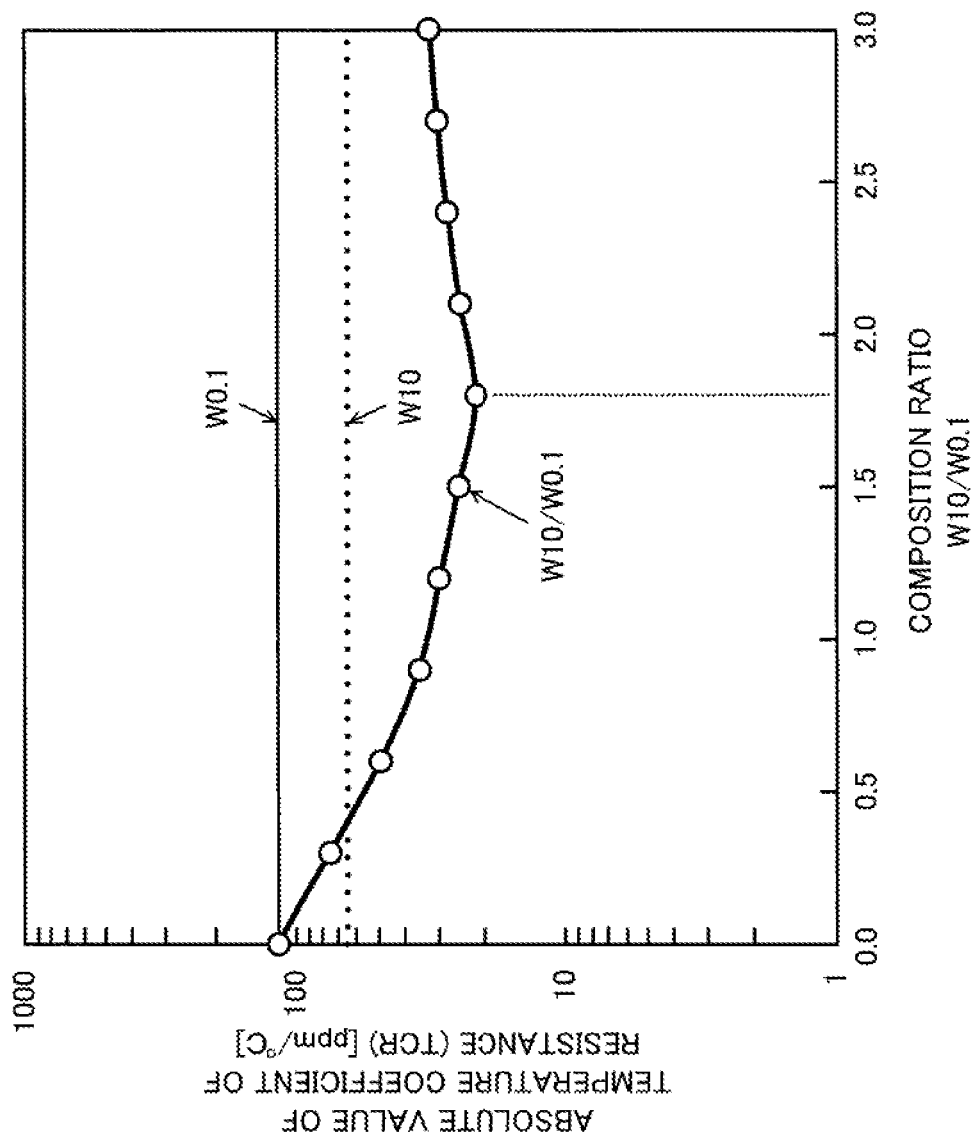
FIG. 12 is a view for describing a resistance element according to a second embodiment (part 3)

FIGS. 10 through 12 are views for describing a resistance element according to a second embodiment.

Polycrystalline silicons containing impurities and having widths W of 0.1 μm and 10 μm are used as resistance elements. This is the same with the above first embodiment. Boron, which is a p-type impurity, is used as impurities contained in the polycrystalline silicons.

FIG. 10 indicates an example of the relationship between boron concentration ($cm^{-3}$) and the absolute value of a TCR (ppm/° C.) for the polycrystalline silicon (W0.1) having a width W of 0.1 μm and the polycrystalline silicon (W10) having a width W of 10 μm. FIG. 10 corresponds to the relationship of FIG. 9 described in the above first embodiment.

If the relationship between boron concentration and the absolute value of a TCR is indicated in FIG. 10 for polycrystalline silicons having different widths W, then the TCR of a polycrystalline silicon having a smaller width W and a polycrystalline silicon having a larger width W are made negative and positive, respectively, by properly setting boron concentration. For example, boron concentrations in the polycrystalline silicons having widths W of 0.1 μm and 10 μm are set to the same concentration $C_Z$ ($4.4 \times 10^{20}$ cm$^{-3}$, in this example). At the concentration $C_Z$, the signs of the TCRs of the polycrystalline silicons having widths W of 0.1 μm and 10 μm are opposite to each other. That is to say, the TCRs of the polycrystalline silicon (W0.1) having a width W of 0.1 μm and the polycrystalline silicon (W10) having a width W of 10 μm are negative and positive respectively.

FIG. 11 indicates an example of the relationship between temperature (° C.) and resistance value ratio (%) for the polycrystalline silicon (W0.1) having a width W of 0.1 μm and containing boron at the concentration $C_Z$ and the polycrystalline silicon (W10) having a width W of 10 μm and containing boron at the concentration $C_Z$. The resistance value ratio represents the ratio of a resistance value at each temperature to a resistance value at a temperature of 25° C.

FIG. 11 indicates the relationship between temperature and resistance value ratio for the polycrystalline silicon having a width W of 0.1 μm and containing boron at the concentration $C_Z$. The coefficient A at the time of approximating this relationship by the use of the above expression (1) is the TCR of the polycrystalline silicon (W0.1). Similarly, FIG. 11 indicates the relationship between temperature and resistance value ratio for the polycrystalline silicon having a width W of 10 μm and containing boron at the concentration $C_Z$. The coefficient A at the time of approximating this relationship by the use of the above expression (1) is the TCR of the polycrystalline silicon (W10).

As indicated in FIG. 11, both the absolute value of the TCR of the polycrystalline silicon (W0.1) having a width W of 0.1 μm and containing boron at the concentration $C_Z$ and the absolute value of the TCR of the polycrystalline silicon (W10) having a width W of 10 μm and containing boron at the concentration $C_Z$ are sufficiently small values and the polycrystalline silicon (W0.1) and the polycrystalline silicon (W10) are usable as resistance elements in a semiconductor device. For example, the absolute values of the TCRs of the polycrystalline silicon (W0.1) and the polycrystalline silicon (W10) are significantly smaller than the TCRs (coefficients A) of the polycrystalline silicon (n-poly) and the diffusion layer (n-diff) each of which contains the n-type impurities and which are described in FIG. 5.

If the polycrystalline silicon having a width W of 0.1 μm and containing boron at the concentration $C_Z$ and the polycrystalline silicon having a width W of 10 μm and containing boron at the concentration $C_Z$ are electrically connected in series, then the dependence of the polycrystalline silicon having a width W of 0.1 μm on temperature and the dependence of the polycrystalline silicon having a width W of 10 μm on temperature cancel out each other. As a result, the TCR of a connected body becomes lower than the TCR of each polycrystalline silicon. A group of polycrystalline silicons connected in this way are formed as a resistance element in a semiconductor device. By doing so, a change in the resistance value of the resistance element caused by the operation of the semiconductor device and deterioration in the performance of the semiconductor device caused by the change in the resistance value of the resistance element are suppressed.

FIG. 12 indicates an example of the relationship between the composition ratio (W10/W0.1) of the polycrystalline silicon (W10) having a width W of 10 μm and containing boron at the concentration $C_Z$ to the polycrystalline silicon (W0.1) having a width W of 0.1 μm and containing boron at the concentration $C_Z$ and the absolute value of a TCR (ppm/° C.).

As indicated in FIG. 12, as the ratio of the polycrystalline silicon (W10) having a width W of 10 μm and containing boron at the concentration $C_Z$ to the polycrystalline silicon (W0.1) having a width W of 0.1 μm and containing boron at the concentration $C_Z$ increases, the absolute value of a TCR decreases slowly and then increases slowly. For example, an increase or decrease in the absolute value of a TCR with the composition ratio (W10/W0.1) is significantly small, compared with the relationship between the composition ratio (n-diff/n-poly) of the diffusion layer containing the n-type impurities to the polycrystalline silicon containing the n-type impurities and the absolute value of a TCR (ppm/° C.) described in FIG. 7.

In the example of FIG. 12, when the composition ratio (W10/W0.1) of the polycrystalline silicon (W10) having a width W of 10 μm and containing boron at the concentration $C_Z$ to the polycrystalline silicon (W0.1) having a width W of 0.1 μm and containing boron at the concentration $C_Z$ is about 1.8, the absolute value of a TCR is minimized. Therefore, the composition ratio (W10/W0.1) of the polycrystalline silicon (W10) having a width W of 10 μm and containing boron at the concentration $C_Z$ to the polycrystalline silicon (W0.1) having a width W of 0.1 μm and containing boron at the concentration $C_Z$ is set to about 1.8. When these polycrystalline silicons are connected, their TCRs effectively cancel out each other and the absolute value of the TCR of a connected body is minimized.

Furthermore, in the example of FIG. 12, even if the composition ratio (W10/W0.1) of the polycrystalline silicon (W10) having a width W of 10 μm and containing boron at the concentration $C_Z$ to the polycrystalline silicon (W0.1) having a width W of 0.1 μm and containing boron at the concentration $C_Z$ deviates from the optimum value (about 1.8), the difference between the absolute value of a TCR obtained and the minimum absolute value of a TCR is small because the absolute value of a TCR increases or decreases slowly. As a result, the composition ratio (W10/W0.1) of the polycrystalline silicon (W10) having a width W of 10 μm and containing boron at the concentration $C_Z$ to the polycrystalline silicon (W0.1) having a width W of 0.1 μm and containing boron at the concentration $C_Z$ is set in a relatively wide range. By forming a group of polycrystalline silicons in a set composition ratio and electrically connecting them in series, a connected body having a low TCR is realized. By forming such a connected body as a resistance element in a semiconductor device, a change in the resistance value of the resistance element caused by the operation of the semiconductor device and deterioration in the performance of the semiconductor device caused by the change in the resistance value of the resistance element are suppressed.

In the above example, boron, which is a p-type impurity, is used as an impurity contained in a polycrystalline silicon. However, an n-type impurity, such as arsenic or phosphorus, may be used as an impurity contained in a polycrystalline silicon.

Next, a third embodiment will be described.

Figure 13:
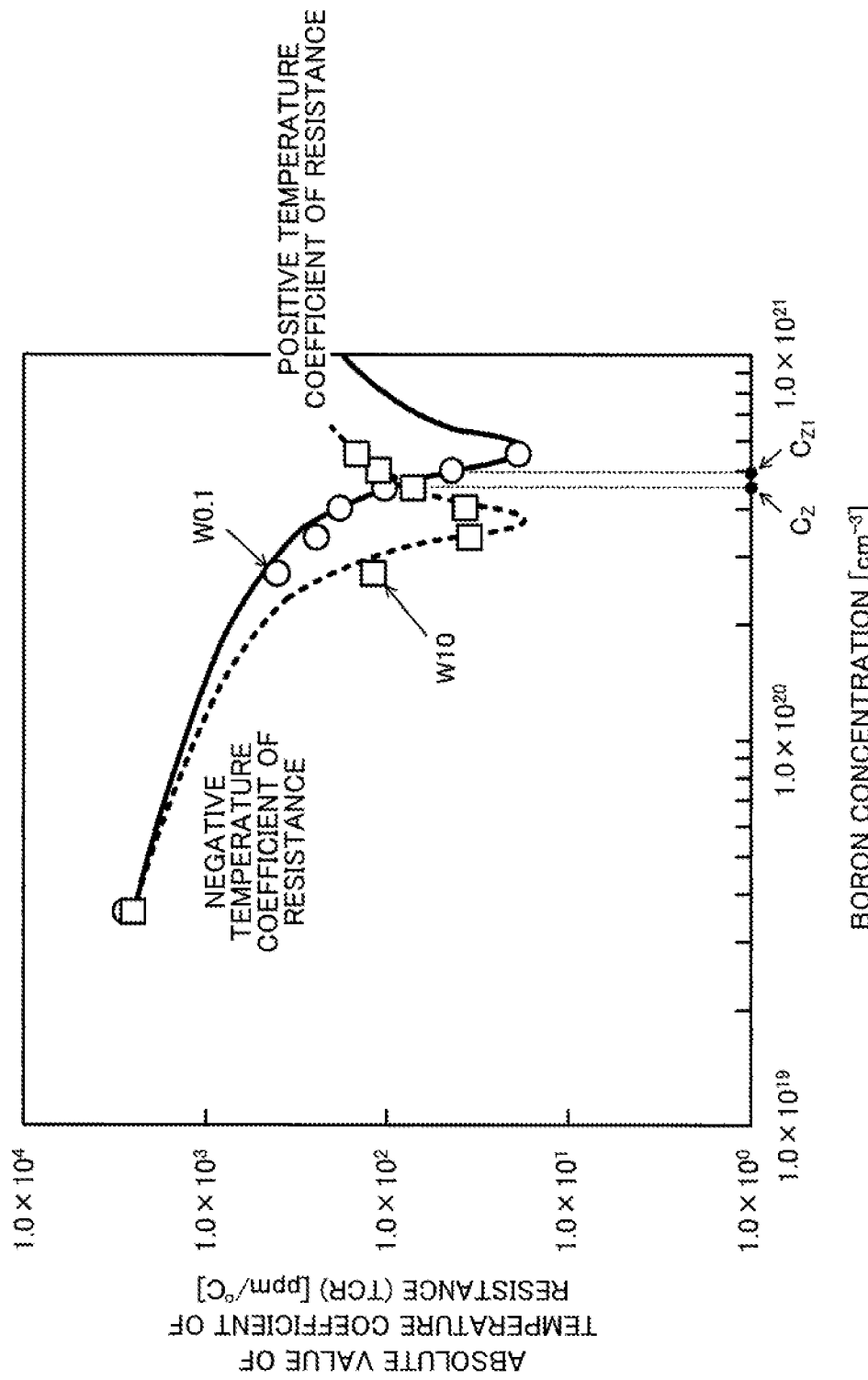
FIG. 13 is a view for describing a resistance element according to a third embodiment (part 1)
Figure 14:
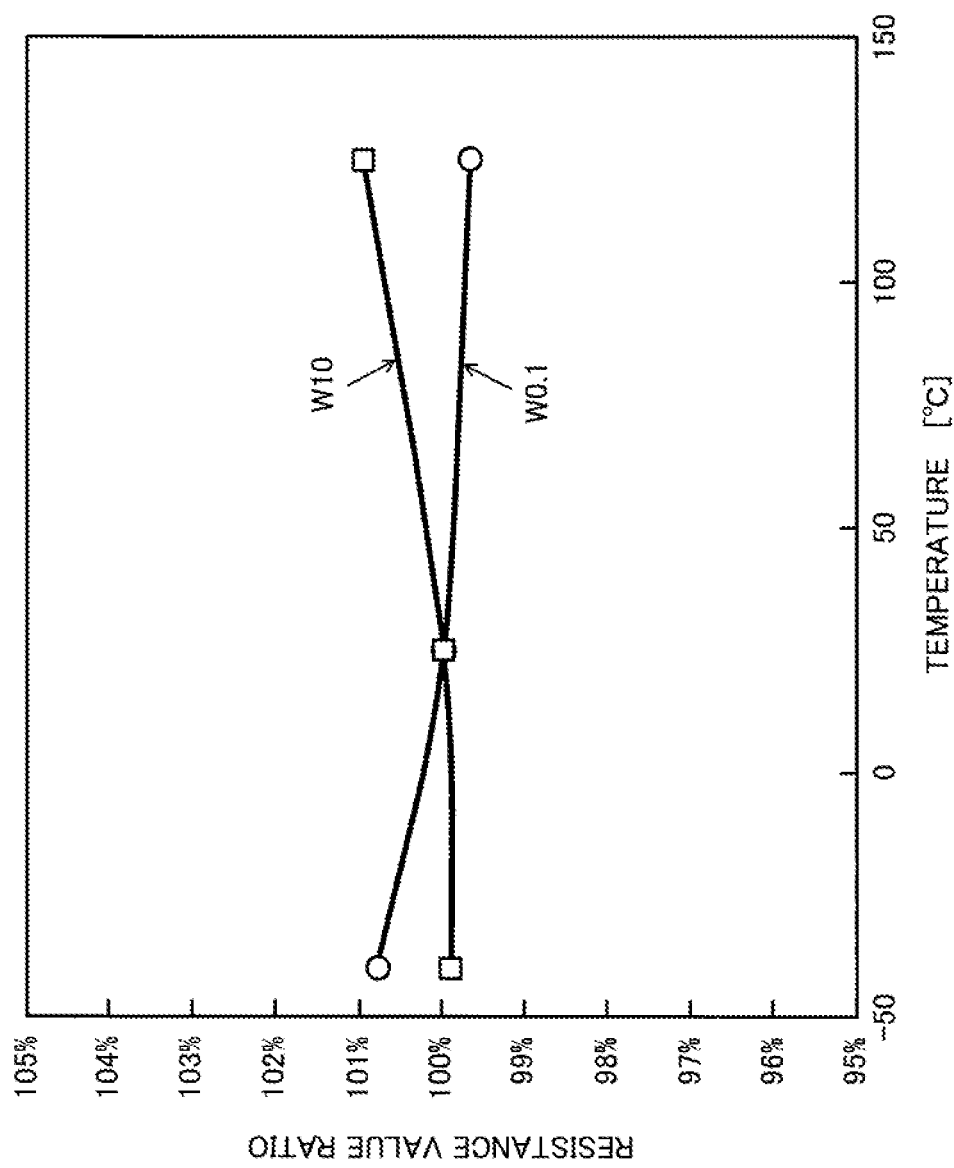
FIG. 14 is a view for describing a resistance element according to a third embodiment (part 2)
Figure 15:
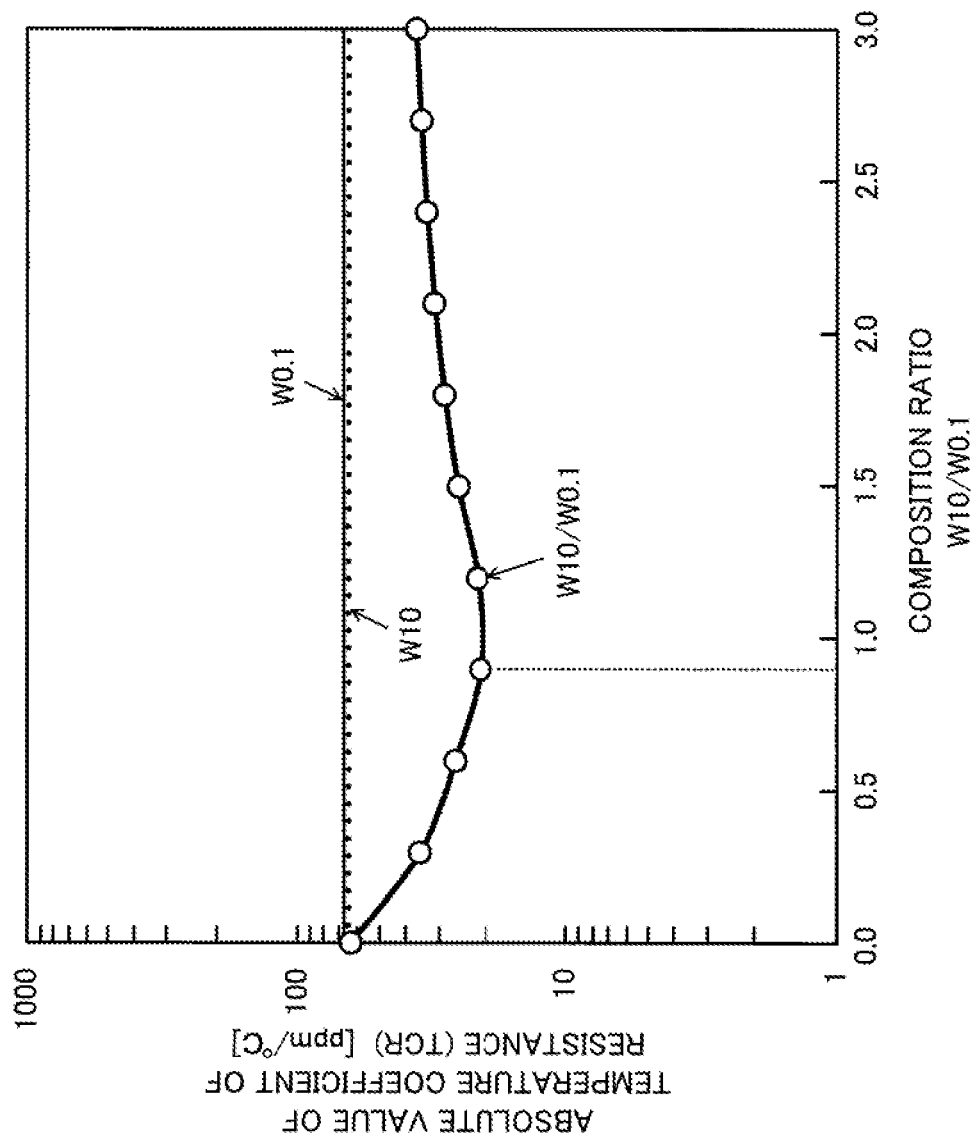
FIG. 15 is a view for describing a resistance element according to a third embodiment (part 3)

FIGS. 13 through 15 are views for describing a resistance element according to a third embodiment.

Polycrystalline silicons containing impurities and having widths W of 0.1 μm and 10 μm are used as resistance elements. This is the same with the above first and second embodiments. Boron, which is a p-type impurity, is used as impurities contained in the polycrystalline silicons.

FIG. 13 indicates an example of the relationship between boron concentration (cm$^{-3}$) and the absolute value of a TCR (ppm/° C.) for the polycrystalline silicon (W0.1) having a width W of 0.1 μm and the polycrystalline silicon (W10) having a width W of 10 μm. FIG. 13 corresponds to the relationships of FIGS. 9 and 10 described in the above first and second embodiments respectively.

The third embodiment differs from the above second embodiment in that boron concentration in the polycrystalline silicon having a width W of 0.1 μm is higher than boron concentration in the polycrystalline silicon having a width W of 10 μm. For example, boron concentration in the polycrystalline silicon having a width W of 0.1 μm is set to a concentration $C_{Z1}$ (4.8×10$^{20}$ cm$^{-3}$, in this example) and boron concentration in the polycrystalline silicon having a width W of 10 μm is set to a concentration $C_Z$ (4.4×10$^{20}$ cm$^{-3}$, in this example) lower than the concentration $C_{Z1}$. As indicated in FIG. 13, the TCR of the polycrystalline silicon (W0.1) having a width W of 0.1 μm becomes negative at the concentration $C_{Z1}$ and the TCR of the polycrystalline silicon (W10) having a width W of 10 μm becomes positive at the concentration $C_Z$.

FIG. 14 indicates an example of the relationship between temperature (° C.) and resistance value ratio (%) for the polycrystalline silicon (W0.1) having a width W of 0.1 μm and containing boron at the concentration $C_{Z1}$ and the polycrystalline silicon (W10) having a width W of 10 μm and containing boron at the concentration $C_Z$. The resistance value ratio represents the ratio of a resistance value at each temperature to a resistance value at a temperature of 25° C.

FIG. 14 indicates the relationships between temperature and resistance value ratio for the polycrystalline silicon (W0.1) having a width W of 0.1 μm and containing boron at the concentration $C_{Z1}$ and the polycrystalline silicon (W10) having a width W of 10 μm and containing boron at the concentration $C_Z$. The coefficients A at the time of approximating these relationships by the use of the above expression (1) are the TCRs of the polycrystalline silicon (W0.1) and the polycrystalline silicon (W10). The absolute values of the TCRs of both the polycrystalline silicon (W0.1) and the polycrystalline silicon (W10) are sufficiently small values and the polycrystalline silicon (W0.1) and the polycrystalline silicon (W10) are usable as resistance elements in a semiconductor device.

Furthermore, with the polycrystalline silicon (W0.1) having a width W of 0.1 μm and containing boron at the concentration $C_{Z1}$ higher than the concentration $C_Z$ described in the above second embodiment, the absolute value of the TCR is small compared with the above second embodiment.

By electrically connecting the polycrystalline silicon having a width W of 0.1 μm and containing boron at the concentration $C_{Z1}$ and the polycrystalline silicon having a width W of 10 μm and containing boron at the concentration $C_Z$ in series, the dependence of the polycrystalline silicon having a width W of 0.1 μm on temperature and the dependence of the polycrystalline silicon having a width W of 10 μm on temperature cancel out each other. As a result, the TCR of a connected body is low compared with the above second embodiment. A group of polycrystalline silicons connected in this way are formed as a resistance element in a semiconductor device. By doing so, a change in the resistance value of the resistance element caused by the operation of the semiconductor device and deterioration in the performance of the semiconductor device caused by the change in the resistance value of the resistance element are suppressed.

FIG. 15 indicates an example of the relationship between the composition ratio (W10/W0.1) of the polycrystalline silicon (W10) having a width W of 10 μm and containing boron at the concentration $C_Z$ to the polycrystalline silicon (W0.1) having a width W of 0.1 μm and containing boron at the concentration $C_{Z1}$ and the absolute value of a TCR (ppm/° C.).

As indicated in FIG. 15, as the ratio of the polycrystalline silicon (W10) having a width W of 10 μm and containing boron at the concentration $C_Z$ to the polycrystalline silicon (W0.1) having a width W of 0.1 μm and containing boron at the concentration $C_{Z1}$ increases, the absolute value of a TCR decreases slowly and then increases slowly.

In the example of FIG. 15, when the composition ratio (W10/W0.1) of the polycrystalline silicon (W10) having a width W of 10 μm and containing boron at the concentration $C_Z$ to the polycrystalline silicon (W0.1) having a width W of 0.1 μm and containing boron at the concentration $C_{Z1}$ is about 0.9, the absolute value of a TCR is minimized. When the polycrystalline silicon having a width W of 0.1 μm and the polycrystalline silicon having a width W of 10 μm are connected in this composition ratio (W10/W0.1), the TCRs of the polycrystalline silicon having a width W of 0.1 μm and the polycrystalline silicon having a width W of 10 μm effectively cancel out each other and the absolute value of the TCR of a connected body is minimized.

Furthermore, in the example of FIG. 15, even if the composition ratio (W10/W0.1) of the polycrystalline silicon (W10) having a width W of 10 μm to the polycrystalline silicon (W0.1) having a width W of 0.1 μm deviates from the optimum value (about 0.9), the difference between the absolute value of a TCR obtained and the minimum absolute value of a TCR is small because the absolute value of a TCR increases or decreases slowly. This is the same with FIG. 12. As a result, the composition ratio (W10/W0.1) of the polycrystalline silicon (W10) having a width W of 10 μm and containing boron at the concentration $C_Z$ to the polycrystalline silicon (W0.1) having a width W of 0.1 μm and containing boron at the concentration $C_{Z1}$ is set in a relatively wide range. By forming a group of polycrystalline silicons in a set composition ratio and electrically connecting them in series, a connected body having a low TCR is realized. By forming such a connected body as a resistance element in a semiconductor device, a change in the resistance value of the resistance element caused by the operation of the semiconductor device and deterioration in the performance of the semiconductor device caused by the change in the resistance value of the resistance element are suppressed.

In addition, in the third embodiment the absolute value of a TCR obtained at the time of connecting the polycrystalline silicon having a width W of 0.1 μm and the polycrystalline silicon having a width W of 10 μm is made small in a range in which the composition ratio (W10/W0.1) is low, compared with the above second embodiment. That is to say, the ratio of the polycrystalline silicon having a width W of 10 μm is reduced. As a result, the percentage of a space (area or volume) in a semiconductor device occupied by a resistance element formed of a connected body of the polycrystalline silicon having a width W of 0.1 μm and the polycrystalline silicon having a width W of 10 μm is reduced.

This leads to, for example, miniaturization of a semiconductor device or improvement in the flexibility of the arrangement of components (not only resistance elements but also circuit elements, such as transistors and wirings) included in a semiconductor device.

In the above example, boron, which is a p-type impurity, is used as an impurity contained in a polycrystalline silicon. However, an n-type impurity, such as arsenic or phosphorus, may be used as an impurity contained in a polycrystalline silicon.

Next, a fourth embodiment will be described.

An example of a method for fabricating a semiconductor device including a resistance element formed by the use of a polycrystalline silicon will now be described as a fourth embodiment.

Figure 16:
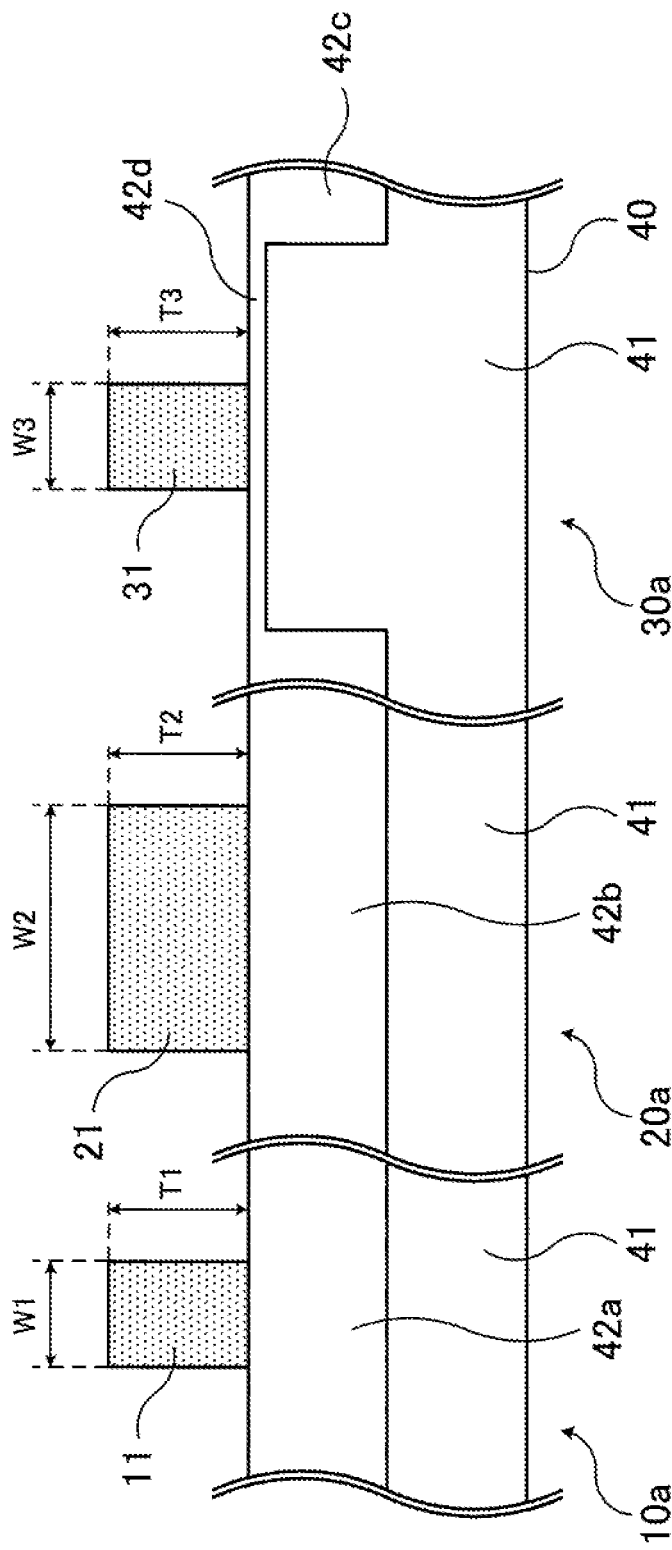
FIG. 16 is a view for describing a semiconductor device fabrication method according to a fourth embodiment (part 1)
Figure 17:
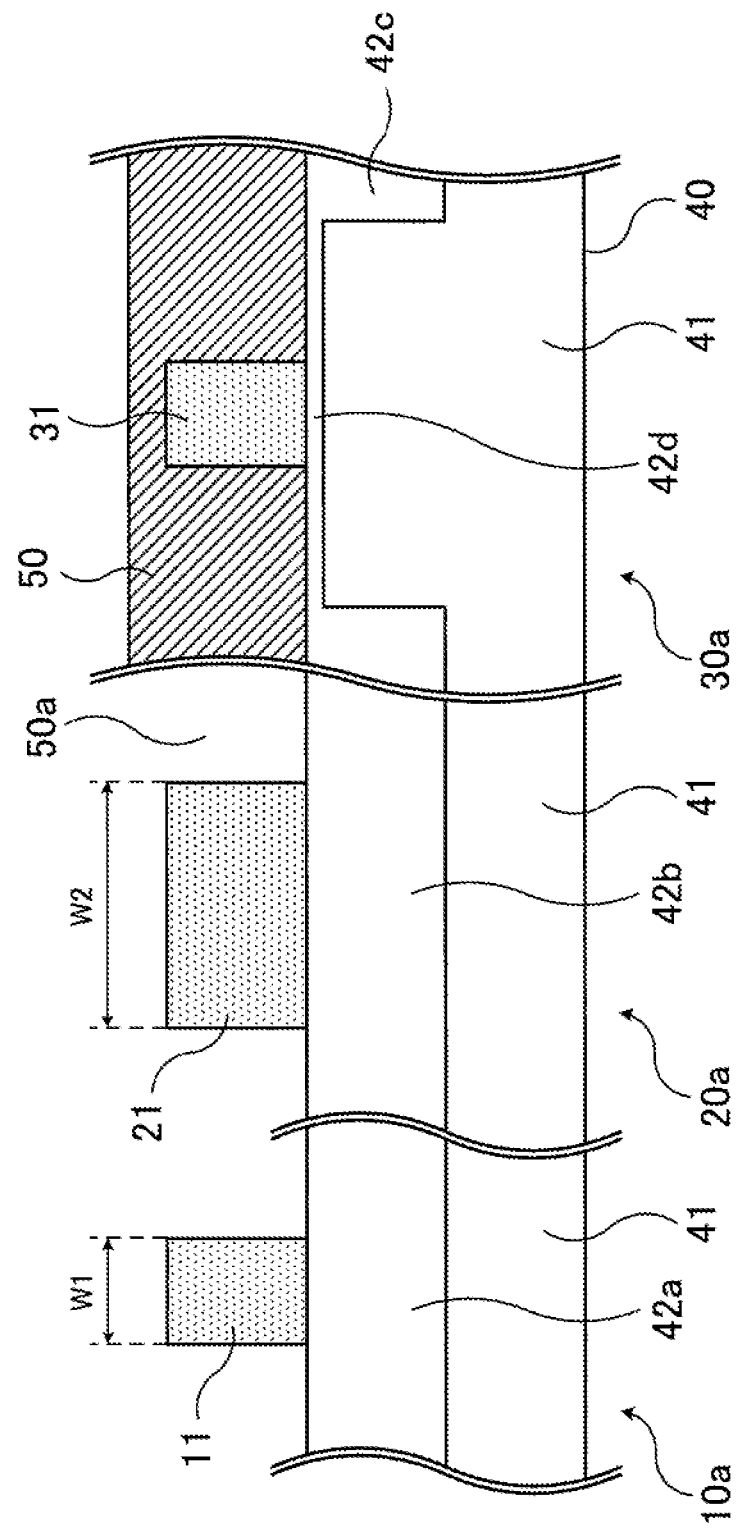
FIG. 17 is a view for describing a semiconductor device fabrication method according to a fourth embodiment (part 2)
Figure 18:
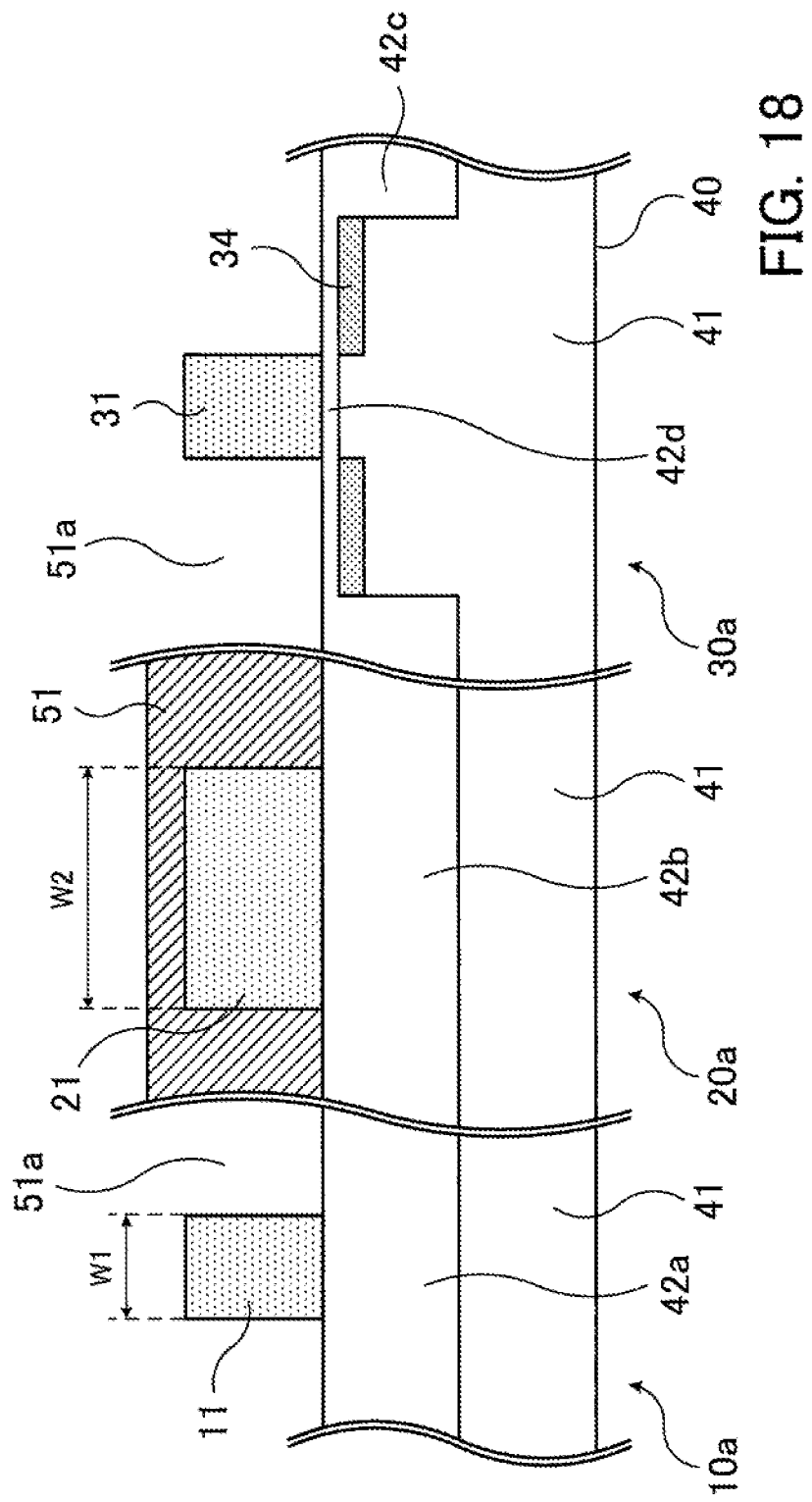
FIG. 18 is a view for describing a semiconductor device fabrication method according to a fourth embodiment (part 3)
Figure 19:
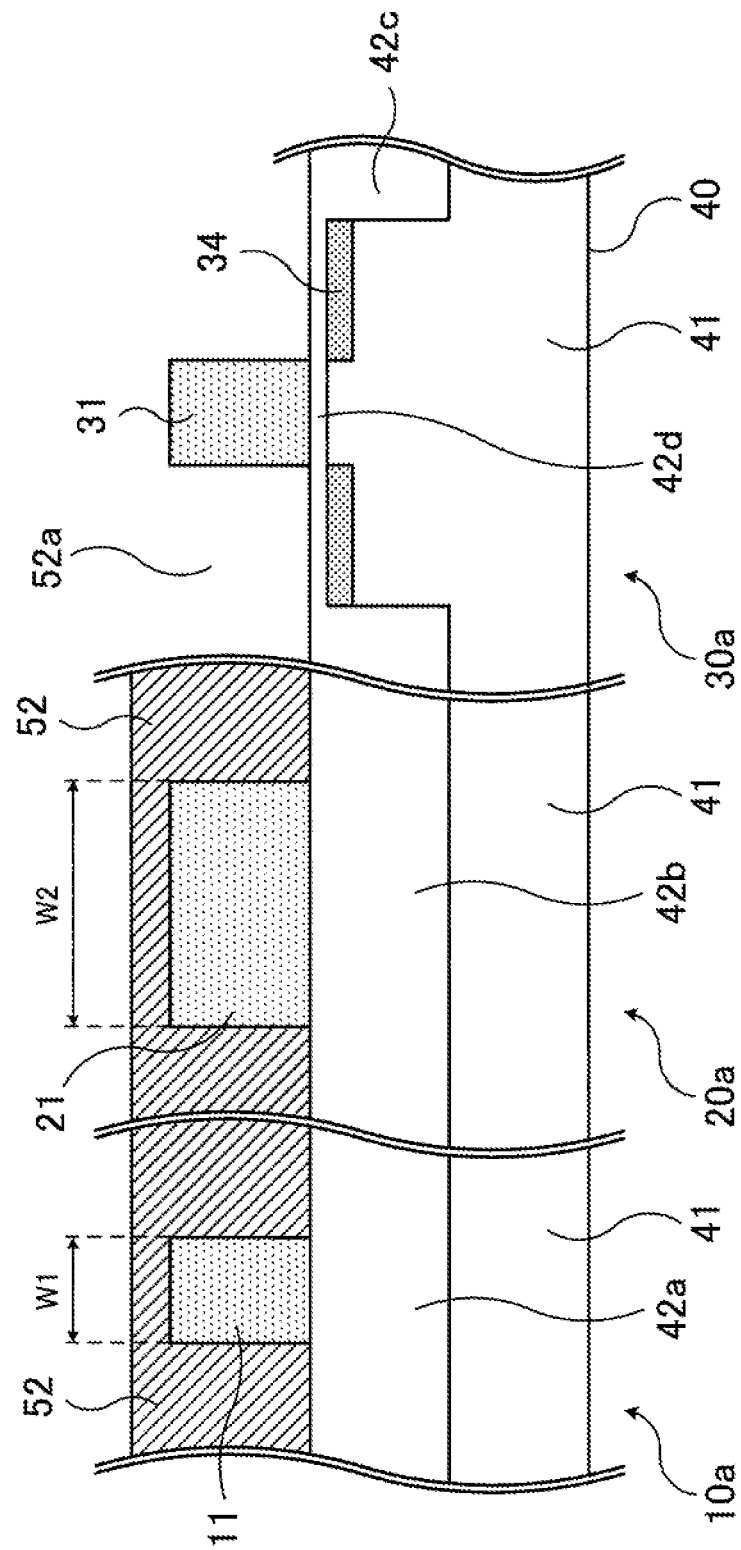
FIG. 19 is a view for describing a semiconductor device fabrication method according to a fourth embodiment (part 4)
Figure 20:
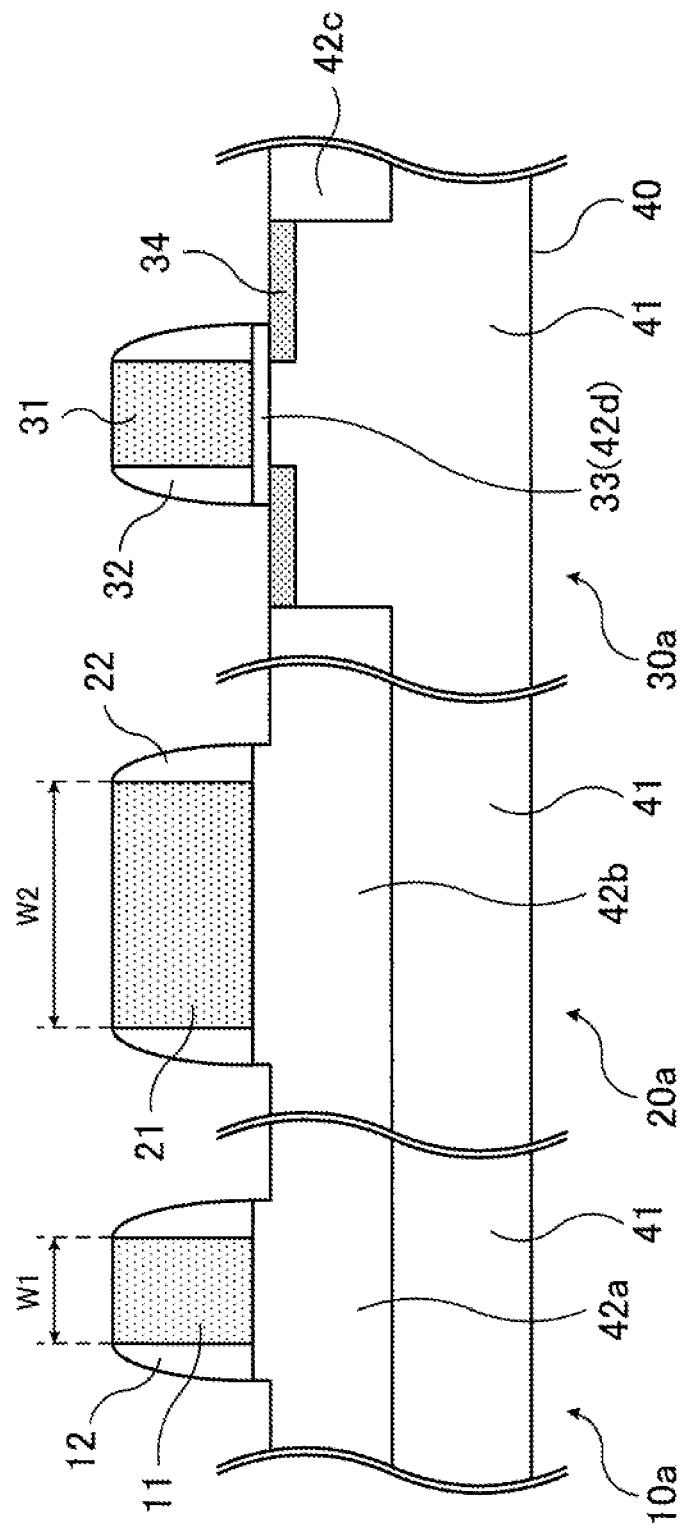
FIG. 20 is a view for describing a semiconductor device fabrication method according to a fourth embodiment (part 5)
Figure 21:
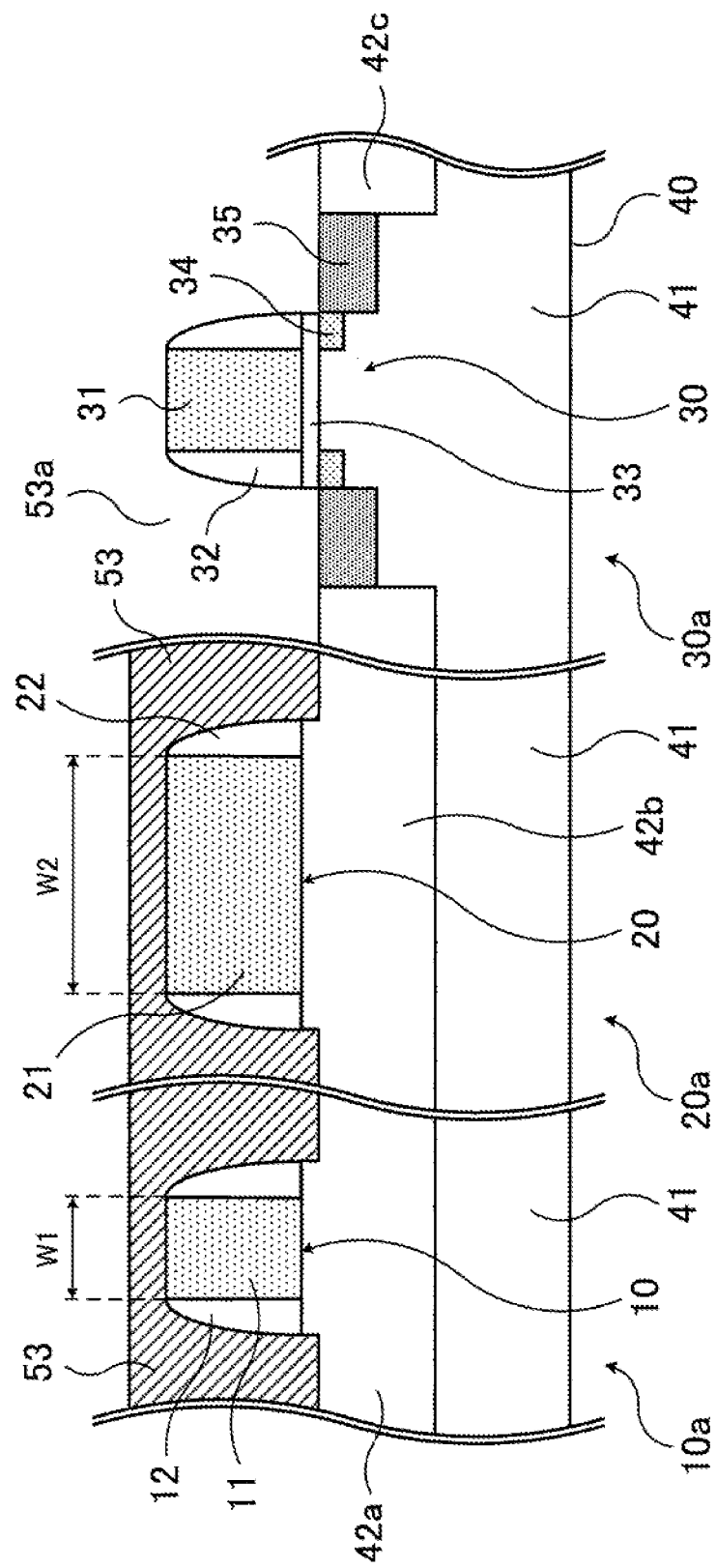
FIG. 21 is a view for describing a semiconductor device fabrication method according to a fourth embodiment (part 6)
Figure 22:
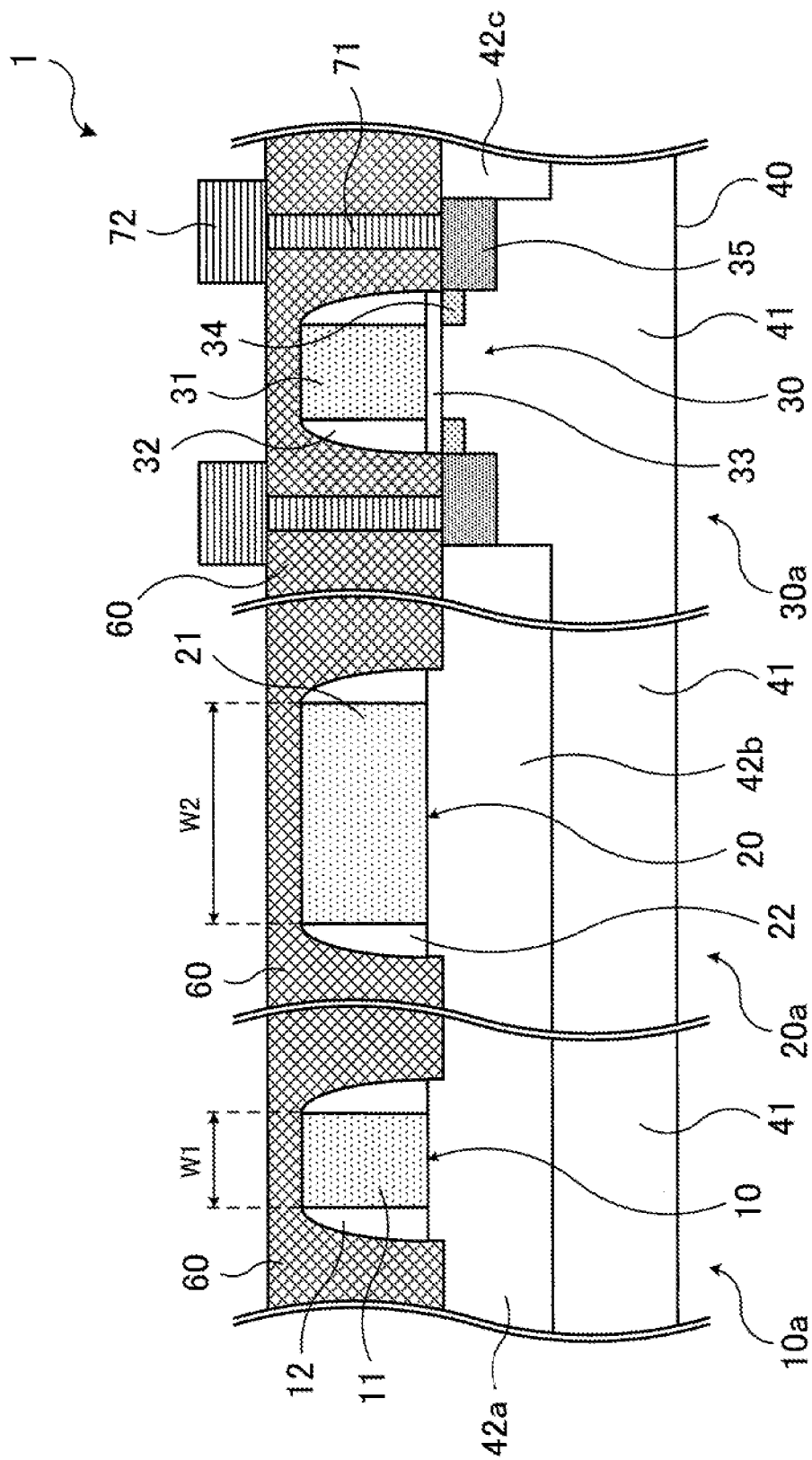
FIG. 22 is a view for describing a semiconductor device fabrication method according to a fourth embodiment (part 7)

FIGS. 16 through 22 are views for describing a semiconductor device fabrication method according to a fourth embodiment. FIG. 16 is a fragmentary schematic sectional view of an example of a polycrystalline silicon pattern formation process. FIG. 17 is a fragmentary schematic sectional view of an example of a first ion implantation process. FIGS. 18 and 19 are fragmentary schematic sectional views of an example of a second ion implantation process. FIG. 20 is a fragmentary schematic sectional view of an example of a sidewall insulating film formation process. FIG. 21 is a fragmentary schematic sectional view of an example of a third ion implantation process. FIG. 22 is a fragmentary schematic sectional view of an example of a conductor portion formation process.

A substrate 40 illustrated in FIG. 16 is prepared. A semiconductor substrate 41, such as a silicon (Si) substrate or a silicon germanium (SiGe) substrate, is used as the substrate 40. The substrate 40 includes an area 10a in which a first resistance element is to be formed, an area 20a in which a second resistance element is to be formed, and an area 30a in which a transistor is to be formed. An insulating film 42a is formed in the semiconductor substrate 41 in the area 10a. An insulating film 42b is formed in the semiconductor substrate 41 in the area 20a. An insulating film 42c which demarcates an element region (active region) and an insulating film 42d over the active region are formed in the semiconductor substrate 41 in the area 30a. The insulating film 42a, the insulating film 42b, and the insulating film 42c are formed by the use of a shallow trench isolation (STI) method, a thermal oxidation method, or the like. The insulating film 42d is formed by the use of the thermal oxidation method or the like.

As illustrated in FIG. 16, a polycrystalline silicon 11, a polycrystalline silicon 21, and a polycrystalline silicon 31 are formed over the above substrate 40. The polycrystalline silicon 11 is formed over the insulating film 42a in the area 10a so as to have a determined width W1 and a determined thickness T1. The polycrystalline silicon 21 is formed over the insulating film 42b in the area 20a so as to have a determined width W2 and a determined thickness T2. The polycrystalline silicon 31 is formed over the insulating film 42d in the area 30a so as to have a determined width W3 and a determined thickness T3. For example, the thickness T1 of the polycrystalline silicon 11, the thickness T2 of the polycrystalline silicon 21, and the thickness T3 of the polycrystalline silicon 31 are equal or approximately equal. The width W2 of the polycrystalline silicon 21 is larger than the width W1 of the polycrystalline silicon 11. For example, the polycrystalline silicon 11, the polycrystalline silicon 21, and the polycrystalline silicon 31 are formed by patterning a polycrystalline silicon layer formed over the substrate 40 by the use of a photolithography technique and an etching technique.

As illustrated in FIG. 17, a resist 50 which covers the area 30a and which has an opening portion 50a in the areas 10a and 20a is then formed over the substrate over which the polycrystalline silicon 11, the polycrystalline silicon 21, and the polycrystalline silicon 31 are formed. Impurity ions are implanted in the polycrystalline silicon 11 in the area 10a and the polycrystalline silicon 21 in the area 20a with the resist 50 as a mask. For example, boron ions are implanted in the polycrystalline silicon 11 and the polycrystalline silicon 21 under the condition that acceleration energy and a dose be 8 keV and $4 \times 10^{15}$ cm$^{-2}$ respectively. The resist 50 is removed after the ion implantation.

By performing the process of FIG. 17, the polycrystalline silicon 11 having the width W1 and containing impurities is formed in the area 10a of the substrate 40 and the polycrystalline silicon 21 having the width W2 larger than the width W1 and containing impurities whose concentration is equal or approximately equal to that of the impurities contained in the polycrystalline silicon 11 is formed in the area 20a of the substrate 40.

As illustrated in FIG. 18, a resist 51 which covers the area 20a and which has an opening portion 51a in the areas 10a and 30a is then formed over the substrate 40. Impurity ions are implanted in the polycrystalline silicon 11 in the area 10a and the polycrystalline silicon 31 in the area 30a with the resist 51 as a mask. For example, boron ions are implanted in the polycrystalline silicon 11 and the polycrystalline silicon 31 under the condition that acceleration energy and a dose be 0.5 keV and $4 \times 10^{14}$ cm$^{-2}$ respectively. The resist 51 is removed after the ion implantation.

By performing the process of FIG. 18, the polycrystalline silicon 11 having the width W1 and containing the impurities is formed in the area 10a of the substrate 40 and the polycrystalline silicon 21 having the width W2 larger than the width W1 and containing the impurities whose concentration is lower than that of the impurities contained in the polycrystalline silicon 11 is formed in the area 20a of the substrate 40. That is to say, a group of polycrystalline silicons which are described in the above first or third embodiment and which differ in impurity concentration and width W are formed. Conditions under which impurity ion implantation is performed in the processes of FIGS. 17 and 18 are set according to the form of a group of polycrystalline silicons to be formed.

Furthermore, by performing the process of FIG. 18, the polycrystalline silicon 31 (gate electrode 31) containing impurities is formed and impurity regions 34 are formed in the semiconductor substrate 41 on both sides of the gate electrode 31, in the area 30a of the substrate 40. The impurity regions 34 function as lightly doped drain (LDD) regions of a transistor (FIG. 22).

In the example of FIG. 18, the resist 51 which covers the area 20a and which has the opening portion 51a in the areas 10a and 30a is formed after the process of FIG. 17 and the ion implantation is performed with the resist 51 as a mask. Alternatively, the following process may be performed. As illustrated in FIG. 19, a resist 52 which covers the areas 10a and 20a and which has an opening portion 52a in the area 30a is formed after the process of FIG. 17 and ion implantation is performed with the resist 52 as a mask. The resist 52 is removed after the ion implantation.

In the process of FIG. 19, the polycrystalline silicon 11 and the polycrystalline silicon 21 formed in the process of FIG. 17 are protected against ion implantation by the resist 52. The polycrystalline silicon 11 having the width W1 and containing the impurities is formed in the area 10a of the substrate 40 and the polycrystalline silicon 21 having the width W2 larger than the width W1 and containing the impurities whose concentration is equal or approximately equal to that of the impurities contained in the polycrystalline silicon 11 is formed in the area 20a of the substrate 40. That is to say, a group of polycrystalline silicons which are described in the above second embodiment, which are equal or approximately equal in impurity concentration, and which differ in width W are formed. Conditions under which impurity ion implantation is performed in the processes of FIGS. 17 and 19 are set according to the form of a group of polycrystalline silicons to be formed.

By performing the process of FIG. 19, the polycrystalline silicon 31 (gate electrode 31) containing impurities is formed and impurity regions 34 (LDD regions) are formed in the semiconductor substrate 41 on both sides of the gate electrode 31, in the area 30a of the substrate 40.

An ion implantation procedure is not limited to a procedure in which the process of FIG. 18 is performed after the process of FIG. 17 or a procedure in which the process of FIG. 19 is performed after the process of FIG. 17. As long as the polycrystalline silicon 11, the polycrystalline silicon 21, the gate electrode (polycrystalline silicon) 31, and the impurity regions 34 each containing impurities at a determined concentration are finally formed, any ion implantation procedure may be adopted.

After the polycrystalline silicon 11, the polycrystalline silicon 21, the gate electrode 31, and the impurity regions 34 each containing impurities at the determined concentration are formed, sidewall insulating films are formed. As illustrated in FIG. 20, a sidewall insulating film 12 is formed on a sidewall of the polycrystalline silicon 11, a sidewall insulating film 22 is formed on a sidewall of the polycrystalline silicon 21, and a sidewall insulating film 32 is formed on a sidewall of the gate electrode 31. The sidewall insulating film 12, the sidewall insulating film 22, and the sidewall insulating film 32 are formed by forming an insulating film, such as an oxide film, a nitride film, or a film formed by laminating them, over the substrate 40 and etching the insulating film. At etching time an insulating film 42a, an insulating film 42b, an insulating film 42c, and an insulating film 42d are partially etched. A gate insulating film 33 (part of the insulating film 42d which remains after the etching) is formed between the semiconductor substrate 41 in the area 30a and the gate electrode 31.

As illustrated in FIG. 21, a resist 53 which covers the areas 10a and 20a and which has an opening portion 53a in the area 30a is then formed over the substrate 40. Impurity ions are implanted in the semiconductor substrate 41 in the area 30a with the resist 53 as a mask. By doing so, impurity regions 35 which function as a source region and a drain region of a transistor 30 are formed so that the impurity regions 35 will be equal in conduction type to the impurity regions 34 previously formed and so that impurity concentration in the impurity regions 35 will be higher than impurity concentration in the impurity regions 34. The resist 53 is removed after the ion implantation.

After the process of FIG. 21, the surfaces of the polycrystalline silicon 11, the polycrystalline silicon 21, the gate electrode 31, and the impurity regions 35 may be silicidated. If silicidation is performed, the following method, for example, is used. A silicide block film is formed in advance in a determined area in which silicidation is not performed, and part or the whole of the surface of each of the polycrystalline silicon 11, the polycrystalline silicon 21, the gate electrode 31, and the impurity regions 35 is silicidated with the silicide block film as a mask. For example, the silicide block film, together with the sidewall insulating films 12, 22, and 32, is formed in advance in the determined area by using the insulating film formed at the time of forming the sidewall insulating films 12, 22, and 32 and using the photolithography technique and the etching technique.

By performing the processes of FIGS. 16 through 21, a resistance element 10 including the polycrystalline silicon 11 having the width W1 and containing the impurities is formed in the area 10a of the substrate 40. A resistance element 20 including the polycrystalline silicon 21 containing the impurities whose concentration is equal or approximately equal to or lower than that of the impurities contained in the polycrystalline silicon 11 and having the width W2 larger than the width W1 of the polycrystalline silicon 11 is formed in the area 20a of the substrate 40. The transistor 30 is formed in the area 30a of the substrate 40.

After the resistance element 10, the resistance element 20, and the transistor 30 are formed, for example, an interlayer insulating film 60 which covers them and conductor portions, such as a plug (contact) 71 and a wiring 72, connected to the transistor 30 are formed as illustrated in FIG. 22. Furthermore, upper wiring layers may be formed in the same way.

A semiconductor device 1 having a structure illustrated in FIG. 22, for example, is obtained in this way.

Next, a fifth embodiment will be described.

An example of the structure of a semiconductor device including a resistance element formed by the use of a polycrystalline silicon will now be described as a fifth embodiment.

Figure 23A:
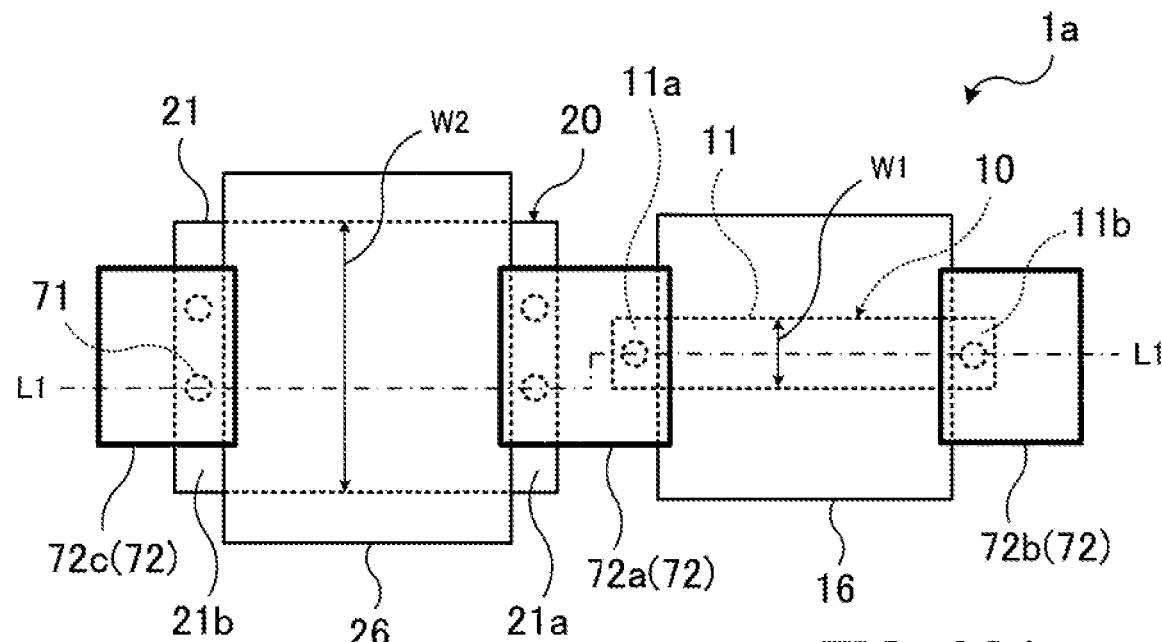
FIGS. 23A and 23B illustrate a first example of the structure of a semiconductor device according to a fifth embodiment.
Figure 23B:
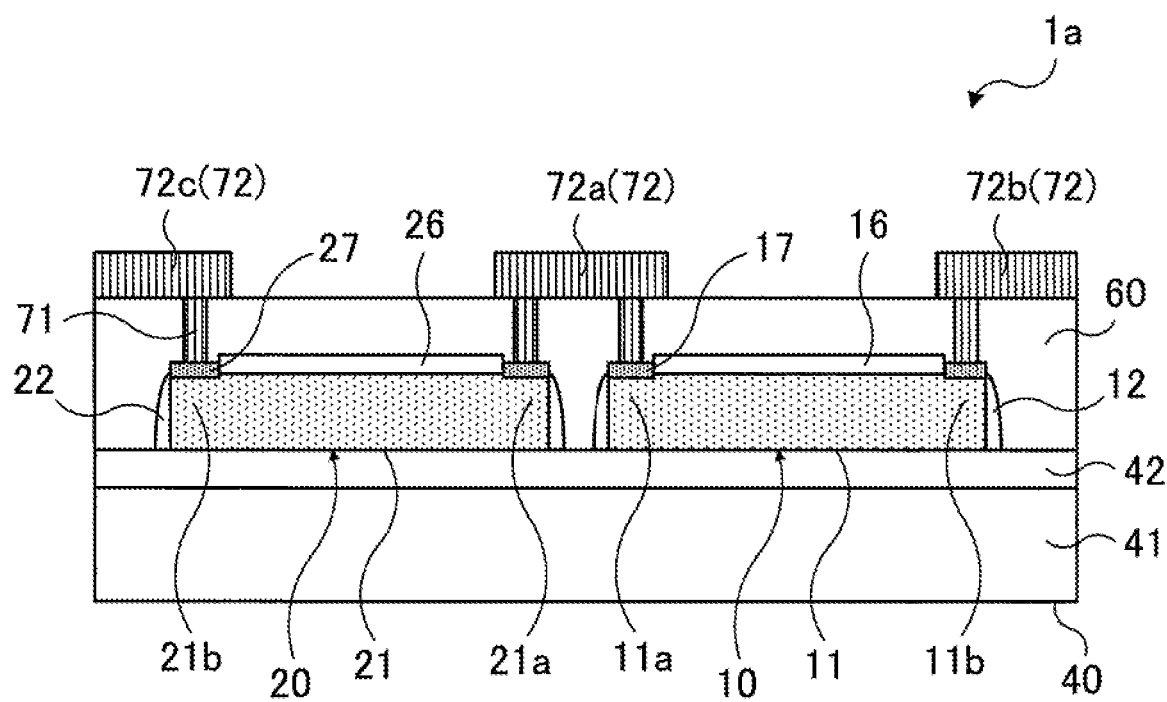

FIGS. 23A and 23B illustrate a first example of the structure of a semiconductor device according to a fifth embodiment. FIG. 23A is a fragmentary schematic layout diagram of a semiconductor device. FIG. 23B is a schematic sectional view taken along the line L1-L1 of FIG. 23A.

FIGS. 23A and 23B illustrate a semiconductor device 1a including a resistance element 10 formed by the use of a polycrystalline silicon 11 and a resistance element 20 formed by the use of a polycrystalline silicon 21. A transistor, such as the transistor 30 described in the above fourth embodiment, is not illustrated in FIG. 23A or 23B. Furthermore, a substrate 40, a sidewall insulating film 12, a sidewall insulating film 22, a silicide layer 17, a silicide layer 27, or an interlayer insulating film 60 illustrated in FIG. 23B is not illustrated in FIG. 23A.

As illustrated in FIG. 23B, the polycrystalline silicon 11 and the polycrystalline silicon 21 are formed over an insulating film 42 of the substrate 40 including a semiconductor substrate 41 and the insulating film 42. As illustrated in FIG. 23A, the polycrystalline silicon 11 has a width W1 and contains impurities at a determined concentration. As illustrated in FIG. 23A, the polycrystalline silicon 21 has a width W2 larger than the width W1 of the polycrystalline silicon 11 and contains impurities whose concentration is lower than or equal or approximately equal to that of the impurities contained in the polycrystalline silicon 11. As illustrated in FIG. 23B, the sidewall insulating film 12 is formed on a sidewall of the polycrystalline silicon 11 and the sidewall insulating film 22 is formed on a sidewall of the polycrystalline silicon 21.

As illustrated in FIG. 23B, the interlayer insulating film 60 is formed over the substrate 40. Contacts 71 electrically connected to the polycrystalline silicon 11 and the polycrystalline silicon 21 are formed in the interlayer insulating film

60. A first-layer wiring 72 (wirings 72a, 72b, and 72c, in this example) is formed over the interlayer insulating film 60.

As illustrated in FIGS. 23A and 23B, a silicide block film 16 and a silicide block film 26 are formed over the polycrystalline silicon 11 and the polycrystalline silicon 21 respectively. As illustrated in FIG. 23B, a silicide layer 17 is formed over the surfaces of end portions 11a and 11b of the polycrystalline silicon 11 which are exposed from the silicide block film 16. As illustrated in FIG. 23B, a silicide layer 27 is formed over the surfaces of end portions 21a and 21b of the polycrystalline silicon 21 which are exposed from the silicide block film 26. The contacts 71 are formed so that they will be connected to the silicide layer 17 and the silicide layer 27.

As illustrated in FIGS. 23A and 23B, a contact 71 connected to the end portion 11a of the polycrystalline silicon 11 and a contact 71 connected to the end portion 21a of the polycrystalline silicon 21 opposite the end portion 11a of the polycrystalline silicon 11 are electrically connected by the wiring 72a. The wiring 72b other than the wiring 72a is electrically connected to a contact 71 connected to the end portion lib of the polycrystalline silicon 11. The wiring 72c other than the wirings 72a and 72b is electrically connected to a contact 71 connected to the end portion 21b of the polycrystalline silicon 21.

The polycrystalline silicon 11 and the polycrystalline silicon 21 are electrically connected in series via these contacts 71 and the wirings 72a, 72b, and 72c.

With the semiconductor device 1a including the polycrystalline silicon 11 with the width W1 and the polycrystalline silicon 21 with the width W2 (>W1) electrically connected in this way in series, deterioration in the performance is suppressed by properly setting impurity concentration in the polycrystalline silicon 11 and the polycrystalline silicon 21.

In other words, impurity concentration in the polycrystalline silicon 11 with the width W1 is set to a concentration at a sign change point of the TCR, that is to say, to a concentration at the time of the absolute value of the TCR being minimized. Similarly, impurity concentration in the polycrystalline silicon 21 with the width W2 larger than the width W1 of the polycrystalline silicon 11 is set to a concentration at a sign change point of the TCR, that is to say, to a concentration at the time of the absolute value of the TCR being minimized. In other words, the technique described in the above first embodiment is adopted. This minimizes both the absolute value of the TCR of the polycrystalline silicon 11 and the absolute value of the TCR of the polycrystalline silicon 21. Therefore, even if the polycrystalline silicon 11 and the polycrystalline silicon 21 are electrically connected in the above way in series in the semiconductor device 1a, the TCR of a connected body formed of the polycrystalline silicon 11 and the polycrystalline silicon 21 is low. This suppresses a change in the resistance value of the connected body caused by the operation of the semiconductor device 1a and deterioration in the performance of the semiconductor device 1a caused by the change in the resistance value of the connected body.

Alternatively, impurity concentration in the polycrystalline silicon 11 with the width W1 is set to a concentration at which the TCR is negative, and impurity concentration in the polycrystalline silicon 21 with the width W2 larger than the width W1 of the polycrystalline silicon 11 is set to a concentration at which the TCR is positive. At this time the impurity concentration in the polycrystalline silicon 21 with the width W2 is equal or approximately equal to or lower than the impurity concentration in the polycrystalline silicon 11 with the width W1. That is to say, the technique described in the above second or third embodiment is adopted. If the polycrystalline silicon 11 and the polycrystalline silicon 21 are electrically connected in the above way in series in the semiconductor device 1a, the dependence of the polycrystalline silicon 11 on temperature and the dependence of the polycrystalline silicon 21 on temperature cancel out each other and the TCR of a connected body formed of the polycrystalline silicon 11 and the polycrystalline silicon 21 is low. This suppresses a change in the resistance value of the connected body caused by the operation of the semiconductor device 1a and deterioration in the performance of the semiconductor device 1a caused by the change in the resistance value of the connected body.

Figure 24A:
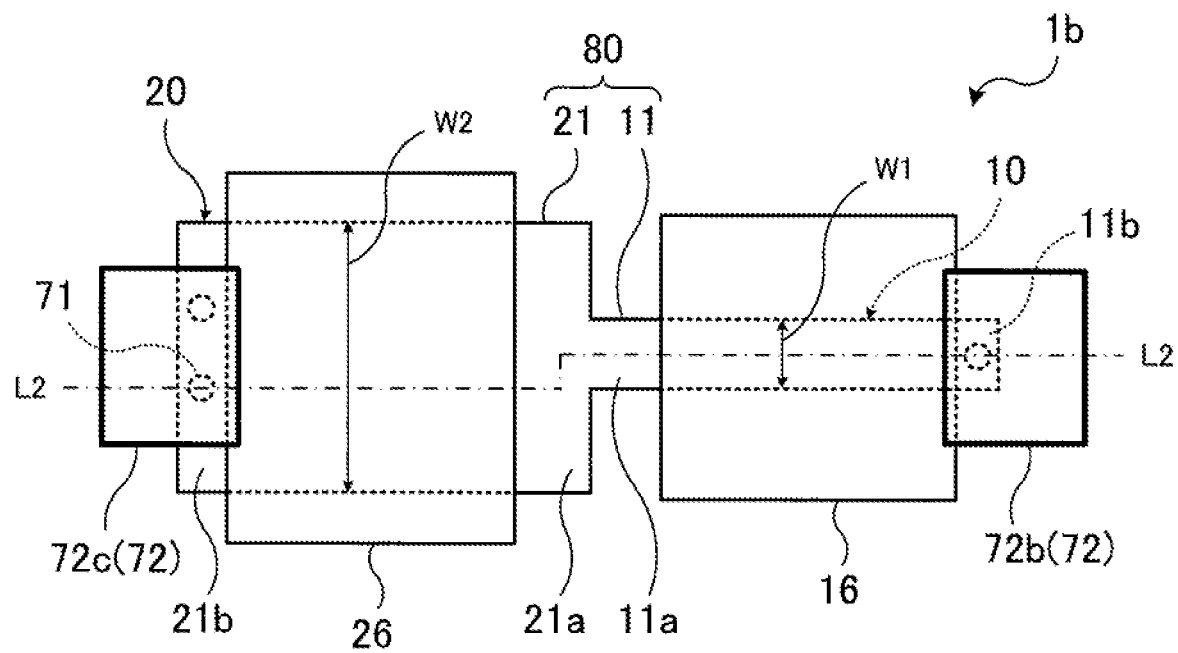
FIGS. 24A and 24B illustrate a second example of the structure of the semiconductor device according to the fifth embodiment.
Figure 24B:
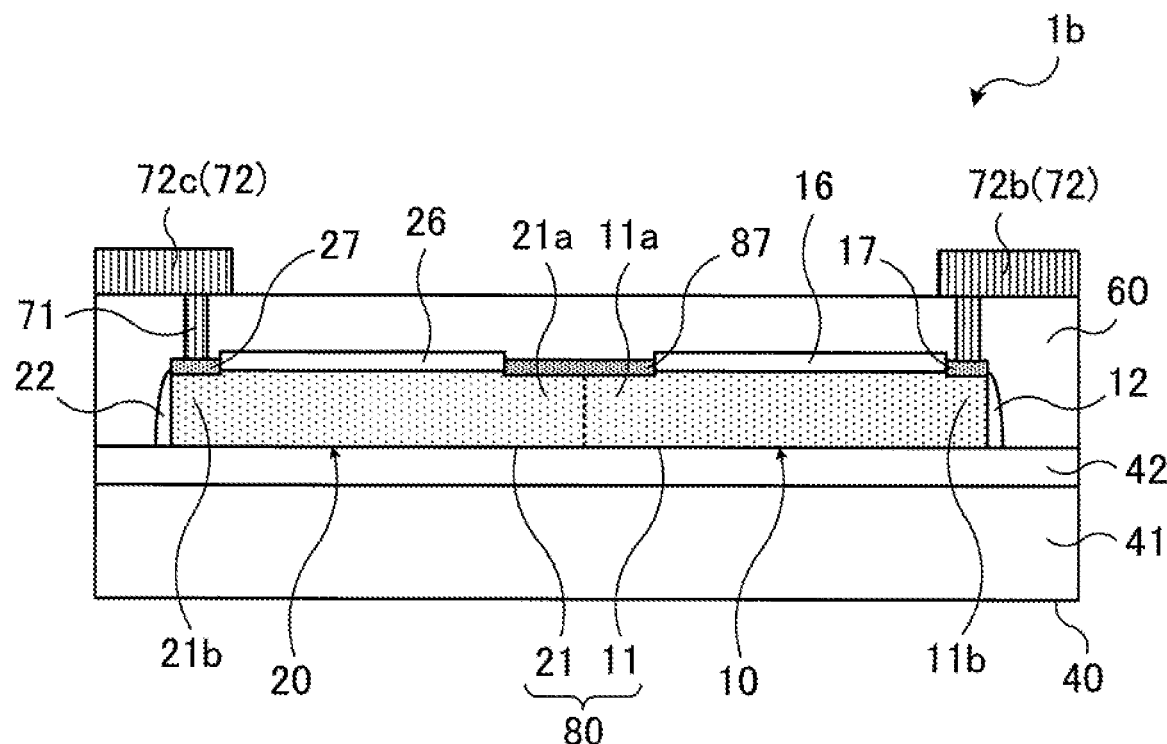

FIGS. 24A and 24B illustrate a second example of the structure of the semiconductor device according to the fifth embodiment. FIG. 24A is a fragmentary schematic layout diagram of the semiconductor device. FIG. 24B is a schematic sectional view taken along the line L2-L2 of FIG. 24A.

With a semiconductor device 1b illustrated in FIGS. 24A and 24B, a polycrystalline silicon 11 of a resistance element 10 and a polycrystalline silicon 21 of a resistance element 20 are formed as continuous one body (polycrystalline silicon 80). By doing so, a structure in which the polycrystalline silicon 11 and the polycrystalline silicon 21 are electrically connected in series is realized. The semiconductor device 1b does not include the wiring 72a and the contacts 71 connected thereto which are formed in the semiconductor device 1a illustrated in FIGS. 23A and 23B. As illustrated in FIG. 24B, a silicide layer 87 is formed over the surface of the polycrystalline silicon 80 between a silicide block film 16 and a silicide block film 26. The semiconductor device 1b is equal in structure to the above semiconductor device 1a in the other respects.

With the semiconductor device 1b having the above structure, deterioration in the performance is also suppressed by properly setting impurity concentration in the polycrystalline silicon 11 with the width W1 and the polycrystalline silicon 21 with the width W2.

That is to say, by adopting the technique described in the above first embodiment and setting impurity concentration, both the absolute value of the TCR of the polycrystalline silicon 11 and the absolute value of the TCR of the polycrystalline silicon 21 are minimized. Alternatively, by adopting the technique described in the above second or third embodiment and setting impurity concentration, the TCR of the polycrystalline silicon 11 is made negative and the TCR of the polycrystalline silicon 21 is made positive. This is the same with the above semiconductor device 1a. Because the polycrystalline silicon 11 and the polycrystalline silicon 21 are electrically connected in series as continuous one body, the TCR of a connected body formed of the polycrystalline silicon 11 and the polycrystalline silicon 21 is low. This suppresses a change in the resistance value of the connected body caused by the operation of the semiconductor device 1b and deterioration in the performance of the semiconductor device 1b caused by the change in the resistance value of the connected body.

Figure 25A:
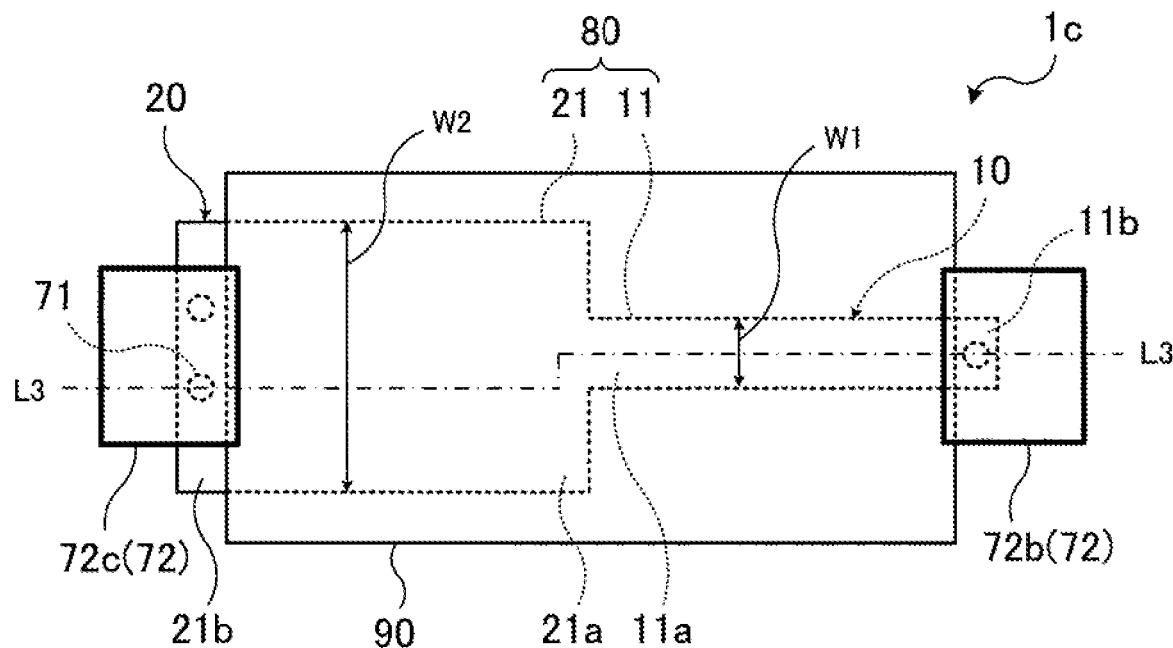
FIGS. 25A and 25B illustrate a third example of the structure of the semiconductor device according to the fifth embodiment.
Figure 25B:
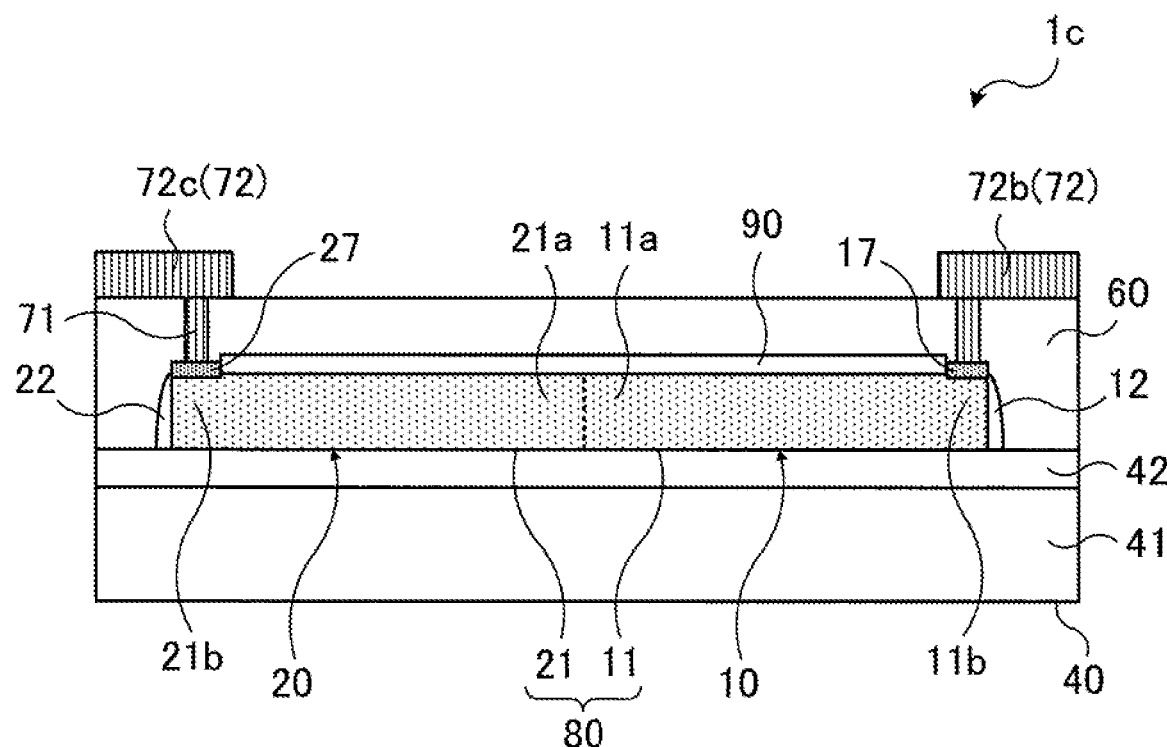

FIGS. 25A and 25B illustrate a third example of the structure of the semiconductor device according to the fifth embodiment. FIG. 25A is a fragmentary schematic layout diagram of the semiconductor device. FIG. 25B is a schematic sectional view taken along the line L3-L3 of FIG. 25A.

A semiconductor device 1c illustrated in FIGS. 25A and 25B differs from the semiconductor device 1b illustrated in FIGS. 24A and 24B in that a common silicide block film 90 extending over a polycrystalline silicon 11 of a resistance element 10 and a polycrystalline silicon 21 of a resistance element 20 is formed. The semiconductor device 1c does not include the silicide layer 87 formed in the semiconductor device 1b. The semiconductor device 1c is equal in structure to the above semiconductor device 1b in the other respects.

The same effect that is obtained by the above semiconductor device 1b is achieved by the semiconductor device 1c using the above silicide block film 90.

Figure 26A:
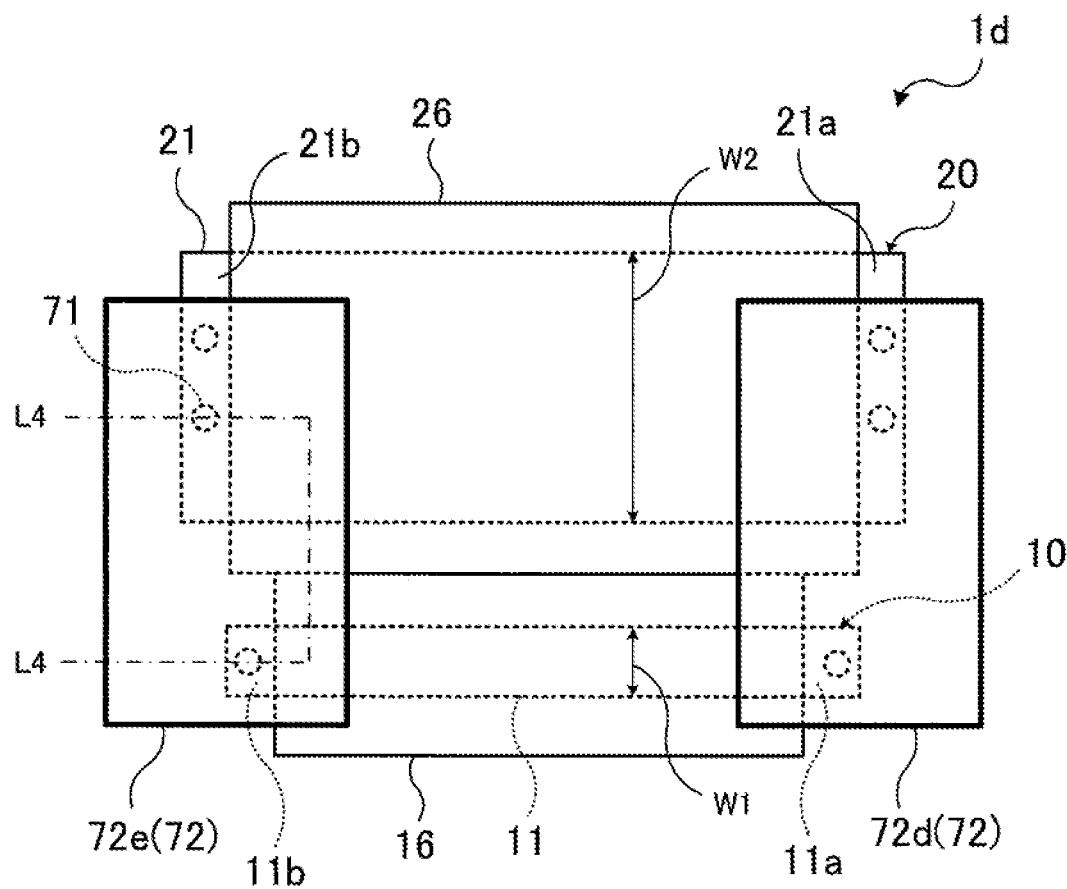
FIGS. 26A and 26B illustrate a fourth example of the structure of the semiconductor device according to the fifth embodiment.
Figure 26B:
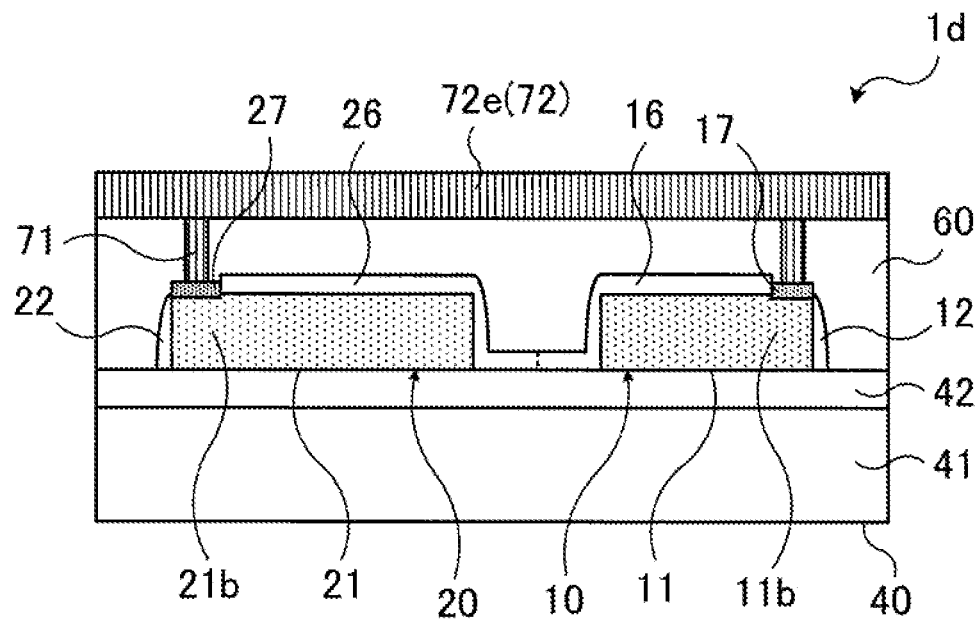

FIGS. 26A and 26B illustrate a fourth example of the structure of the semiconductor device according to the fifth embodiment. FIG. 26A is a fragmentary schematic layout diagram of the semiconductor device. FIG. 26B is a schematic sectional view taken along the line L4-L4 of FIG. 26A.

With a semiconductor device 1d illustrated in FIGS. 26A and 26B, a polycrystalline silicon 11 of a resistance element 10 and a polycrystalline silicon 21 of a resistance element 20 are electrically connected in parallel. That is to say, as illustrated in FIG. 26A, with the semiconductor device 1d a contact 71 connected to one end portion 11a of the polycrystalline silicon 11 and a contact 71 connected to one end portion 21a of the polycrystalline silicon 21 are electrically connected by a wiring 72 (wiring 72d, in this example). A contact 71 connected to the other end portion 11b of the polycrystalline silicon 11 and a contact 71 connected to the other end portion 21b of the polycrystalline silicon 21 are electrically connected by a wiring 72 (wiring 72e, in this example).

A silicide block film 16 and a silicide block film 26 may be separately formed over the polycrystalline silicon 11 and the polycrystalline silicon 21, respectively, or be integrally formed over the polycrystalline silicon 11 and the polycrystalline silicon 21.

With the semiconductor device 1d including the polycrystalline silicon 11 with a width W1 and the polycrystalline silicon 21 with a width W2 (>W1) electrically connected in this way in parallel, deterioration in the performance is also suppressed by properly setting impurity concentration in the polycrystalline silicon 11 and the polycrystalline silicon 21.

That is to say, by adopting the technique described in the above first embodiment and setting impurity concentration, both the absolute value of the TCR of the polycrystalline silicon 11 and the absolute value of the TCR of the polycrystalline silicon 21 are minimized. As a result, even if the polycrystalline silicon 11 and the polycrystalline silicon 21 are electrically connected in the above way in parallel in the semiconductor device 1d, the TCR of a connected body formed of the polycrystalline silicon 11 and the polycrystalline silicon 21 is low. Therefore, a change in the resistance value of the connected body caused by the operation of the semiconductor device 1d and deterioration in the performance of the semiconductor device 1d caused by the change in the resistance value of the connected body are suppressed.

Alternatively, by adopting the technique described in the above second or third embodiment and setting impurity concentration, the TCR of the polycrystalline silicon 11 is made negative and the TCR of the polycrystalline silicon 21 is made positive. Adoption of the technique described in the above second or third embodiment makes the absolute value of the TCR of the polycrystalline silicon 11 and the absolute value of the TCR of the polycrystalline silicon 21 relatively small. Therefore, even if the polycrystalline silicon 11 and the polycrystalline silicon 21 are electrically connected in the above way in parallel in the semiconductor device 1d, the TCR of a connected body formed of the polycrystalline silicon 11 and the polycrystalline silicon 21 is relatively low. As a result, a change in the resistance value of the connected body caused by the operation of the semiconductor device 1d and deterioration in the performance of the semiconductor device 1d caused by the change in the resistance value of the connected body are suppressed.

In the examples of FIGS. 23A, 23B, 24A, 24B, 25A, 25B, 26A, and 26B, the contacts 71 and the wirings 72a through 72e are used for electrically connecting the polycrystalline silicon 11 and the polycrystalline silicon 21, the polycrystalline silicon 11 and another conductor portion, and the polycrystalline silicon 21 and another conductor portion. However, the polycrystalline silicon 11 and the polycrystalline silicon 21, the polycrystalline silicon 11 and another conductor portion, and the polycrystalline silicon 21 and another conductor portion may electrically be connected by another means such as wire connection.

Furthermore, in the above examples the polycrystalline silicon 11 and the polycrystalline silicon 21 are formed over the common substrate 40. The polycrystalline silicon 11 has the width W1 and contains impurities at a determined concentration. The polycrystalline silicon 21 has the width W2 and contains impurities at a determined concentration. The polycrystalline silicon 11 and the polycrystalline silicon 21 are electrically connected to each other. However, the polycrystalline silicon 11 and the polycrystalline silicon 21 may be formed over different substrates (substrates in different semiconductor devices, for example). The polycrystalline silicon 11 has the width W1 and contains the impurities at the determined concentration. The polycrystalline silicon 21 has the width W2 and contains the impurities at the determined concentration. The polycrystalline silicon 11 and the polycrystalline silicon 21 are electrically connected to each other.

The first through fifth embodiments have been described.

As indicated in FIGS. 2 through 4 and 6, with a group of polycrystalline silicons containing impurities of the same kind, the TCRs depend on the width W. A change in impurity concentration leads to a change in the dependence of the TCRs on the width W. In view of this, impurity concentration in each of a group of polycrystalline silicons which differ in width W and which contain impurities of the same kind is set, on the basis of the relationship indicated in FIG. 9, to a concentration at a sign change point of a TCR, that is to say, to a concentration at the time of the absolute value of the TCR being minimized. Alternatively, on the basis of the relationships indicated in FIGS. 10 and 13, impurity concentration in each of a group of polycrystalline silicons which differ in width W and which contain impurities of the same kind is set in the following way. Impurity concentration in a polycrystalline silicon having a smaller width W is set to a concentration at which the TCR is negative, and impurity concentration in a polycrystalline silicon having a larger width W is set to a concentration at which the TCR is positive. In this case, the impurity concentration in the polycrystalline silicon having a larger width W is equal or approximately equal to or lower than the impurity concentration in the polycrystalline silicon having a smaller width W.

As a result, if a group of polycrystalline silicons which differ in width W are formed as a resistance element in a semiconductor device, a significant change in the resistance value of the resistance element caused by a rise and drop in the temperature caused by the operation of the semiconductor device is suppressed and therefore deterioration in the performance of the semiconductor device is suppressed. Accordingly, a semiconductor device which stably demonstrates its performance is realized. In addition, an electronic device or an electronic apparatus in which such a semiconductor device is used and which stably demonstrates its performance is realized.

From FIGS. 2 through 4, 6, 9, 10, and 13, the concentration of impurities of the same kind contained in polycrystalline silicons which differ in width W is set in the range of $1\times10^{20}$ to $1\times10^{21}$ cm$^{-3}$. If the TCR of a polycrystalline silicon having a larger width W (polycrystalline silicon (W10) having a width W of 10 μm, for example) is made positive, a concentration higher than $4\times10^{20}$ cm$^{-3}$ is needed. In such a case, the concentrations of impurities of the same kind contained in polycrystalline silicons having different widths W are set in the range of $4\times10^{20}$ to $1\times10^{21}$ cm$^{-3}$.

According to the disclosed techniques, deterioration in the performance of a semiconductor device caused by the dependence of a resistance element on temperature is suppressed and a semiconductor device which stably demonstrates its performance is realized.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device comprising:
   a first polycrystalline silicon having a negative temperature coefficient and having a first width; and
   a second polycrystalline silicon having a positive temperature coefficient and having a second width larger than the first width, wherein:
   the first polycrystalline silicon contains first impurities at a first concentration throughout a direction perpendicular to a direction of the first width, in a plan view; and
   the second polycrystalline silicon contains the first impurities at a second concentration lower than the first concentration throughout a direction perpendicular to a direction of the second width, in the plan view.

2. The semiconductor device according to claim 1, wherein the first concentration and the second concentration are higher than or equal to $1\times10^{20}$ cm$^{-3}$ and lower than or equal to $1\times10^{21}$ cm$^{-3}$.

3. The semiconductor device according to claim 1, wherein the first polycrystalline silicon and the second polycrystalline silicon are electrically connected in series.

4. The semiconductor device according to claim 1, wherein the first polycrystalline silicon and the second polycrystalline silicon are electrically connected in parallel.

5. The semiconductor device according to claim 1, wherein one end portion of the first polycrystalline silicon and one end portion of the second polycrystalline silicon are electrically connected in series.

6. The semiconductor device according to claim 1, wherein:
   one end portion of the first polycrystalline silicon and one end portion of the second polycrystalline silicon are electrically connected;
   the other end portion of the first polycrystalline silicon and the other end portion of the second polycrystalline silicon are electrically connected; and
   the first polycrystalline silicon and the second polycrystalline silicon are electrically connected in parallel.

7. The semiconductor device according to claim 1, wherein the first impurities are p-type impurities.

8. The semiconductor device according to claim 1, wherein the first polycrystalline silicon and the second polycrystalline silicon are formed as continuous one body and electrically connected.

9. The semiconductor device according to claim 8, wherein the first polycrystalline silicon and the second polycrystalline silicon are electrically connected in series.

10. The semiconductor device according to claim 1, wherein a first sheet resistance of the first polycrystalline silicon is higher than a second sheet resistance of the second polycrystalline silicon.

11. A semiconductor device comprising:
    a first polycrystalline silicon having a negative temperature coefficient and having a first width; and
    a second polycrystalline silicon having a positive temperature coefficient and having a second width larger than the first width, wherein:
    the first polycrystalline silicon and the second polycrystalline silicon are provided in a same layer;
    the first polycrystalline silicon contains first impurities at a first concentration; and
    the second polycrystalline silicon contains the first impurities at a second concentration lower than the first concentration.

12. The semiconductor device according to claim 11, wherein:
    the first polycrystalline silicon contains the first impurities at the first concentration throughout a direction perpendicular to a direction of the first width, in a plan view; and
    the second polycrystalline silicon contains the first impurities at the second concentration throughout a direction perpendicular to a direction of the second width, in the plan view.

13. The semiconductor device according to claim 11, wherein the first polycrystalline silicon and the second polycrystalline silicon are electrically connected in series.

14. The semiconductor device according to claim 11, wherein the first polycrystalline silicon and the second polycrystalline silicon are electrically connected in parallel.

15. The semiconductor device according to claim 11, wherein the first polycrystalline silicon and the second polycrystalline silicon are formed as continuous one body and electrically connected.

16. The semiconductor device according to claim 11, wherein a first sheet resistance of the first polycrystalline silicon is higher than a second sheet resistance of the second polycrystalline silicon.

17. A semiconductor device comprising:
    a first polycrystalline silicon having a negative temperature coefficient and having a first width; and
    a second polycrystalline silicon having a positive temperature coefficient and having a second width larger than the first width, wherein:
    the first polycrystalline silicon contains first impurities at a first concentration;
    the second polycrystalline silicon contains the first impurities at a second concentration lower than the first concentration; and
    a first sheet resistance of the first polycrystalline silicon is higher than a second sheet resistance of the second polycrystalline silicon.

18. The semiconductor device according to claim 17, wherein the first polycrystalline silicon and the second polycrystalline silicon are electrically connected in series.

19. The semiconductor device according to claim 17, wherein the first polycrystalline silicon and the second polycrystalline silicon are electrically connected in parallel.

20. The semiconductor device according to claim 17, wherein the first polycrystalline silicon and the second polycrystalline silicon are formed as continuous one body and electrically connected.

* * * * *